(12) United States Patent
Kim

(10) Patent No.: US 10,276,668 B2
(45) Date of Patent: Apr. 30, 2019

(54) LOWER CYLINDERICAL ELECTRODES FORMING A HONEY COMB STRUCTURE WITH PLURALITY SUPPORT STRUCTURES

(71) Applicant: Samsung Electronics Co., Ltd., Suwon-si, Gyeonggi-do (KR)

(72) Inventor: Ji-hoon Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/800,538

(22) Filed: Nov. 1, 2017

(65) Prior Publication Data

US 2018/0166542 A1    Jun. 14, 2018

(30) Foreign Application Priority Data

Dec. 8, 2016    (KR) .................. 10-2016-0166886

(51) Int. Cl.
| | | |
|---|---|---|
| *H01L 27/108* | (2006.01) | |
| *H01L 29/40* | (2006.01) | |
| *H01L 27/02* | (2006.01) | |
| *H01L 29/41* | (2006.01) | |
| *H01L 21/311* | (2006.01) | |
| *H01L 21/768* | (2006.01) | |
| *H01L 49/02* | (2006.01) | |

(Continued)

(52) U.S. Cl.
CPC ........ *H01L 29/401* (2013.01); *H01L 21/0337* (2013.01); *H01L 21/31144* (2013.01); *H01L 21/768* (2013.01); *H01L 21/76801* (2013.01); *H01L 23/64* (2013.01); *H01L 27/0207* (2013.01); *H01L 27/108* (2013.01); *H01L 28/60* (2013.01); *H01L 28/91* (2013.01); *H01L 29/41* (2013.01)

(58) Field of Classification Search
CPC ............... H01L 29/401; H01L 21/0337; H01L 21/3114; H01L 21/76801; H01L 23/64; H01L 27/0207; H01L 27/108; H01L 28/60; H01L 28/91
See application file for complete search history.

(56) References Cited

U.S. PATENT DOCUMENTS

| 8,043,925 B2 | 10/2011 | Yang et al. |
| 8,384,143 B2 | 2/2013 | Hirota |

(Continued)

FOREIGN PATENT DOCUMENTS

| JP | 2014241325 A | 12/2014 |
| KR | 1020050042624 A | 10/2005 |

(Continued)

*Primary Examiner* — Alonzo Chambliss
(74) *Attorney, Agent, or Firm* — Harness, Dickey & Pierce, P.L.C.

(57) ABSTRACT

A semiconductor device including a plurality of lower electrodes on a substrate, the plurality of lower electrodes in a first direction and a second direction perpendicular to the first direction to form rows and columns, a support structure having a flat panel form, the support structure connecting and supporting the plurality of lower electrodes, the support structure including a plurality of open areas defined therein, the support structure including two different shapes in an alternating manner may be provided. The plurality of open areas may have a same shape and partially expose sides of all the plurality of lower electrodes.

20 Claims, 17 Drawing Sheets

(51) Int. Cl.
    *H01L 23/64*    (2006.01)
    *H01L 21/033*   (2006.01)

(56) References Cited

U.S. PATENT DOCUMENTS

| | | | |
|---|---|---|---|
| 8,399,916 | B2 | 3/2013 | Kadoya |
| 9,087,729 | B2 * | 7/2015 | Park ........................ H01L 24/14 |
| 10,032,778 | B2 * | 7/2018 | Kim .................. H01L 27/10852 |
| 10,079,237 | B2 * | 9/2018 | Kim .................. H01L 27/10808 |
| 2005/0093046 | A1 | 5/2005 | Ahn |
| 2007/0234538 | A1 | 10/2007 | Ahn |
| 2015/0041973 | A1 * | 2/2015 | Park ........................ H01L 24/14 |
| | | | 257/737 |
| 2016/0043089 | A1 | 2/2016 | Song et al. |
| 2018/0019243 | A1 * | 1/2018 | Kim .................. H01L 27/10808 |
| 2018/0166320 | A1 * | 6/2018 | Kim .................... H01L 21/7687 |
| 2018/0331112 | A1 * | 11/2018 | Kim .................. H01L 27/10852 |

FOREIGN PATENT DOCUMENTS

| | | |
|---|---|---|
| KR | 1020090000519 | 1/2009 |
| KR | 1014690980000 | 12/2014 |

* cited by examiner

LOWER CYLINDERICAL ELECTRODES FORMING A HONEY COMB STRUCTURE WITH PLURALITY SUPPORT STRUCTURES

CROSS-REFERENCE TO RELATED APPLICATION

This application claims priority under 35 U.S.C. § 119 to Korean Patent Application No. 10-2016-0166886, filed on Dec. 8, 2016 in the Korean Intellectual Property Office, the disclosure of which is incorporated herein in its entirety by reference.

BACKGROUND

The inventive concepts relate to semiconductor devices, and more particularly, to semiconductor devices including a support structure to prevent a collapse of lower electrodes.

Recently, as integration of semiconductor devices advances due to rapid development of precision semiconductor manufacturing technologies, the size of a unit cell has been significantly reduced, and accordingly an area of a capacitor in the unit cell has been reduced. For example, the level of integration of semiconductor memory devices such as dynamic random access memory (DRAM) has increased and areas occupied by devices have decreased, while a capacitance value are desired to be maintained at a same level or even to be increased. According to such requests, an aspect ratio of lower electrodes has been greatly increased. As a result, lower electrodes may collapse or break before a dielectric layer is formed thereon.

SUMMARY

Some of the inventive concepts provide semiconductor devices including a support structure in which lower electrodes are exposed for a smooth subsequent process while preventing a collapse of lower electrodes.

Some of the inventive concepts provide methods of manufacturing a semiconductor device including a support structure in which lower electrodes are exposed for a smooth subsequent process while preventing a collapse of lower electrodes.

According to an aspect of the inventive concepts, a semiconductor device includes a plurality of lower electrodes in a honeycomb structure, and a support structure connecting and supporting the plurality of lower electrodes, the support structure including a plurality of open areas, the plurality of lower electrodes exposed by the plurality of open areas. The plurality of lower electrodes in the honeycomb structure may be arranged such that one lower electrode at a center point of a hexagon and six lower electrodes at vertices of the hexagon and adjacent to the one lower electrode configures a first hexagonal structure, the six lower electrodes at the vertices of the first hexagonal structure serves as lower electrodes at center points of six other hexagonal structures, and the one lower electrode at the center point of the first hexagonal structure serves as a lower electrode at one of six vertices of each of six other hexagonal structures. The support structure may include the plurality of open areas in which three side areas of the one lower electrode at the center point of the first hexagonal structure are exposed by the plurality of open areas, and two side areas of the six lower electrodes at the vertices of the first hexagonal structure are exposed by the plurality of open areas.

According to another aspect of the inventive concepts, a semiconductor device includes a plurality of lower electrodes on a substrate, the plurality of lower electrodes in a first direction and a second direction perpendicular to the first direction to form rows and columns, and a support structure having a flat panel form, the support structure connecting and supporting the plurality of lower electrodes, the support structure including a plurality of open areas defined therein, the support structure including two different shapes in an alternating manner in a third direction, the plurality of open areas having a same shape and partially exposing sides of all the plurality of lower electrodes According to still another aspect of the inventive concepts, a semiconductor device includes a plurality of lower electrodes in rows and columns on a substrate, the plurality of lower electrodes in a honeycomb structure, the honeycomb structure including one lower electrode at a center point of a hexagon and six lower electrodes at vertices of the hexagon and adjacent to the one lower electrode, the six lower electrodes at the vertices of the hexagon serving as lower electrodes at center points of other six hexagons, the one lower electrode at the center point of the hexagon serving as a lower electrode at one of six vertices of each of other six hexagons, and a support structure connecting and supporting the plurality of lower electrodes, the support structure including a plurality of first support patterns and a second support pattern, the plurality of first support patterns each having a circular shape, the second support pattern surrounding the plurality of first support patterns and separated from each of the plurality of first support patterns.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Figure 1:
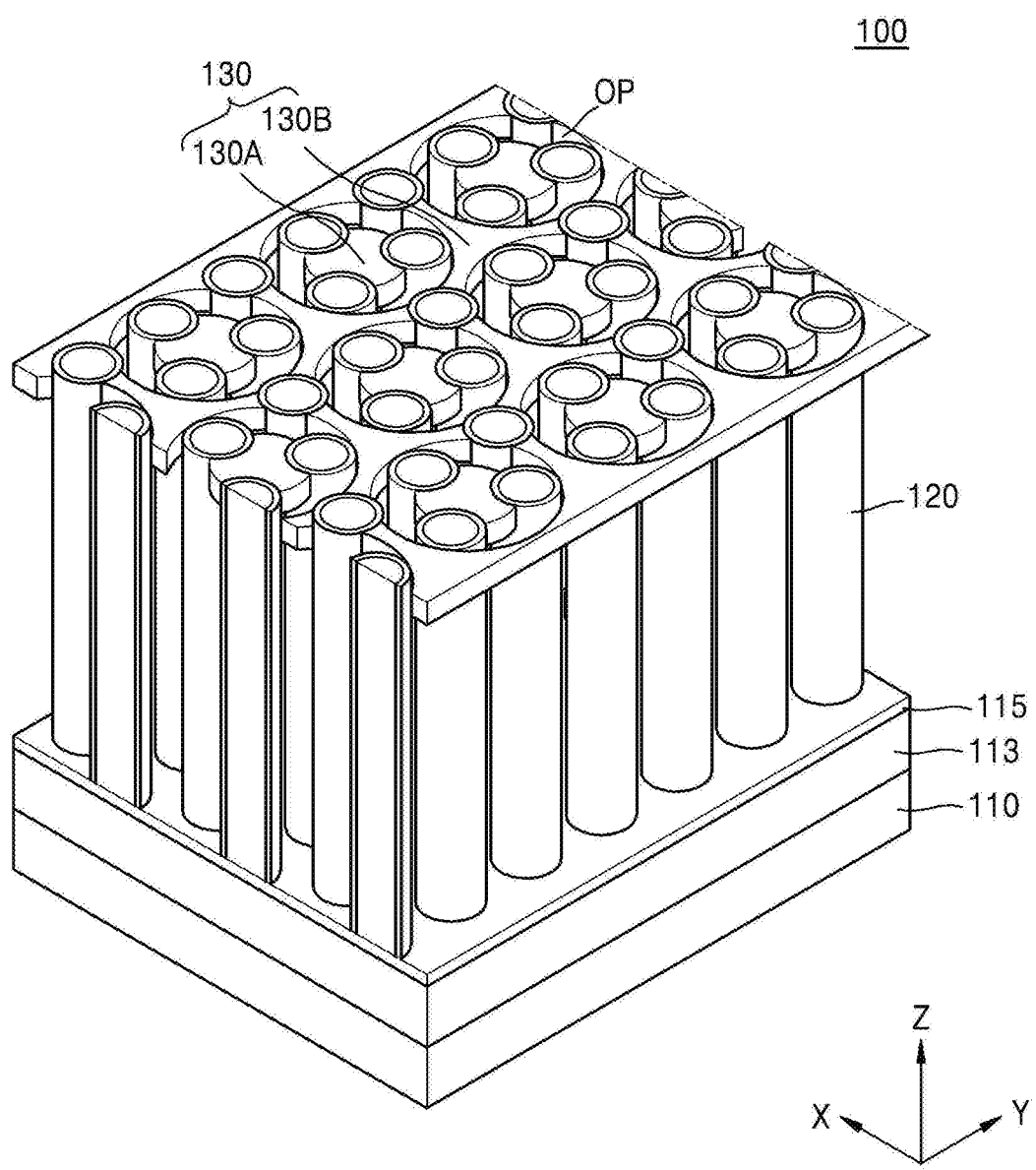
FIG. 1 is a schematic perspective view of a plurality of lower electrodes and a support structure of a semiconductor device, according to an example embodiment of the inventive concepts.

FIG. 1 is a schematic perspective view of a plurality of lower electrodes 120 and a support structure 130 of a semiconductor device 100, according to an example embodiment of the inventive concepts.

Referring to FIG. 1, the semiconductor device 100 may include a charge storage, for example, a capacitor. The capacitor may include a storage electrode (e.g., the lower electrodes 120) having a cylindrical structure in order to increase capacitance. For convenience of description, a dielectric layer 150 (see FIG. 14B), upper electrodes 160 (see FIG. 14B) and contact plugs 111 (see FIG. 14B) are omitted.

In the semiconductor device 100 according to an example embodiment, the lower electrode 120 may have a cylinder-type structure as shown in FIG. 1, or may have a pillar-type structure according to some example embodiments. In some other example embodiments, the lower electrode 120 may be formed such that the pillar-type structure is arranged below the cylinder-type structure.

The plurality of lower electrodes 120 may be arranged in a first direction (e.g., an X-direction) and a second direction (e.g., a Y-direction) to form rows and columns. To secure spaces between the plurality of lower electrodes 120, the lower electrodes 120 on any one row may be misaligned (e.g., arranged to be not aligned) relative to the lower electrodes 120 on another adjacent row. For example, x-coordinates of the lower electrodes 120 on any one row may be different from those of the lower electrodes 120 on another adjacent row. A relatively large space between the plurality of lower electrodes 120 may be secured by misaligning the plurality of lower electrodes 120 relative to each other. Thus, such relatively large space between the plurality of lower electrodes 120 may contribute to a uniform formation of a dielectric layer in subsequent processes (e.g., a dielectric layer formation process).

Further, the plurality of lower electrodes 120 may be arranged to form a honeycomb structure (or arrangement), in which one lower electrode is arranged at a center of a hexagon surrounded by six (6) neighboring lower electrodes arranged at six (6) vertices of the hexagon. Such honeycomb structure (or arrangement) of the plurality of lower electrodes 120 will be described in more detail in FIG. 2.

An aspect ratio of the plurality of lower electrodes 120 may be very large. For example, the aspect ratio of the plurality of lower electrodes 120 may range from about 10 to about 30. According to some example embodiments, a diameter of each of the plurality of lower electrodes 120 may range from about 20 nm to about 100 nm and a height thereof may range from about 500 nm to about 4000 nm. However, sizes of structures of the plurality of lower electrodes 120 are not limited thereto.

As the aspect ratio of the plurality of lower electrodes 120 increases, the plurality of lower electrodes 120 may be prone to collapse or fracture. Thus, according to some example embodiments, the semiconductor device 100 may further include the support structure 130 to prevent the collapse of the plurality of lower electrodes 120.

The support structure 130 may include a plurality of open areas OP. The support structure 130 may include a first support pattern 130A and a second support pattern 130B, which has a different shape from that of the first support pattern 130A. The open areas OP may be arranged according to certain rules. Each of the open areas OP may expose six lower electrodes 120 as illustrated in FIG. 1.

For an open area OP of the support structure 130 to expose, for example, the six lower electrodes 120, the support structure 130 may be formed prior to forming a dielectric layer on the plurality of lower electrodes 120. Once a dielectric layer 150 (see FIG. 14B) and an upper electrode 160 (see FIG. 14B) are formed, the plurality of lower electrodes 120 are covered by the dielectric layer 150 and the upper electrode 160. Thus, the plurality of lower electrodes 120 may not be exposed outwardly. The open areas OP refer to an area exposed by the support structures 130 (for example, in a flat type) and an area of the lower electrodes 120 that is not in contact with the support structure 130. The open area does not refer to an area exposed by the semiconductor device 100.

The support structure 130 may be formed on upper end sides of the plurality of lower electrodes 120 and may function as a structure supporting spaces between the plurality of lower electrodes 120. Accordingly, the support structure 130 may expose upper surfaces of the plurality of lower electrodes 120 as illustrated.

The open area OP may have a structure such that a portion of each of the six lower electrodes 120 (e.g., a portion of a side surface thereof) is exposed. A level or an extent of exposing of the side surface of the plurality of lower electrodes 120 via the open area OP may vary depending on the structure of the open area OP.

As a ratio of the exposed portions of the lower electrodes 120 increase, a subsequent process for forming, for example, a dielectric layer may be performed in a relatively smooth and/or uniform manner. On the other hand, as the ratio of the exposed portions of the lower electrodes 120 decrease, such subsequent process may not be performed in a relatively smooth and/or uniform manner. Thus, as the number of exposed lower electrodes 120 increases, formation of the dielectric layer may not be performed with respect to the lower electrode 120 in a relatively smooth and/or uniform manner. Accordingly, performance or reliability of the semiconductor device 100 may deteriorate.

Structures and layouts of the open area OP and the support structure 130 will be described in detail with reference to FIGS. 13A and 13B below.

The semiconductor device 100 according to an example embodiment may include the support structure 130 having a high exposure ratio. For example, the support structure 130 may include the plurality of open areas OP that respectively expose six lower electrodes 120 and support the plurality of lower electrodes 120. Accordingly, subsequent processes may be facilitated, thereby improving reliability of the semiconductor device 100.

Further, a process of forming the support structure 130 including the plurality of open areas OP may be performed by using a conventional photolithography process without additionally performing additional photolithography process for forming a fine pattern.

Figure 2:
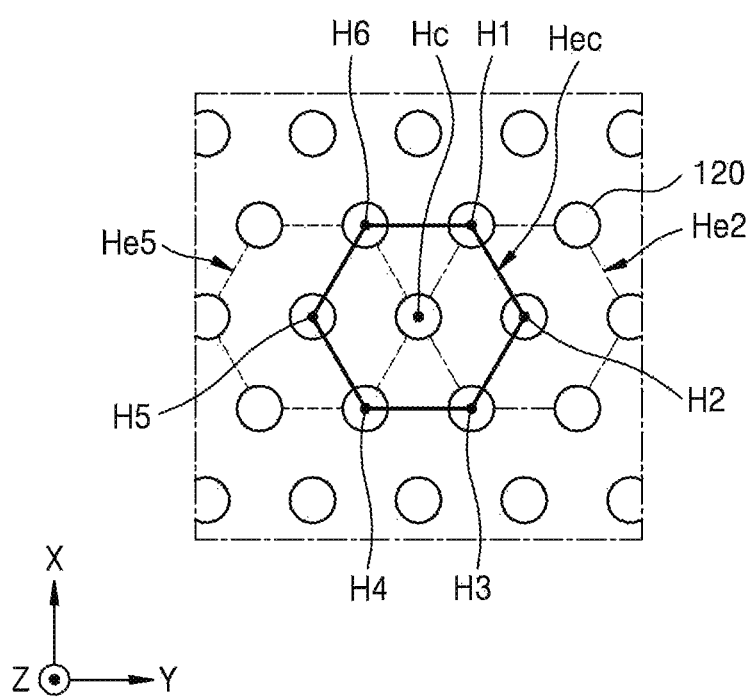
FIG. 2 is a conceptual diagram for describing a layout of a honeycomb structure of a plurality of lower electrodes of a semiconductor device, according to an example embodiment of the inventive concepts.

FIG. 2 is a conceptual diagram for describing a layout of a honeycomb structure (or arrangement) of the plurality of lower electrodes 120 of the semiconductor device 100, according to an example embodiment of the inventive concepts.

Referring to FIG. 2, the plurality of lower electrodes 120 of the semiconductor device 100 (see FIG. 1) according to an example embodiment may have a honeycomb structure. The honeycomb structure may include a structure wherein the plurality of lower electrodes 120 are arranged at vertices H1, H2, H3, H4, H5 and H6 and at a center point Hc of a hexagon. The plurality of lower electrodes 120 may have a structure where the honeycomb structures continuously overlap each other along the first direction (the X-direction) and the second direction (the Y-direction) as illustrated.

For example, the plurality of lower electrodes 120 may have a structure where the six vertices H1, H2, H3, H4, H5 and H6 of a center hexagon Hec (denoted as a solid line) are respective center points of six adjacent hexagons, and the center point Hc of the center hexagon Hec is equally shared by the six adjacent hexagons. For example, a second vertex H2 may be a center point of a second hexagon He2 (denoted as a long-short dashed line), a fifth vertex H5 may be a center point of a fifth hexagon He5 (denoted as a dashed line), and the center point Hc of the center hexagon Hec may be shared as one of the six vertices by the second hexagon He2 and the fifth hexagon He5.

A hexagon having the honeycomb structure of the plurality of lower electrodes 120 may be a regular hexagon. Further, all of the six triangles sharing the center point Hc may be regular triangles. Accordingly, a same gap may be maintained between adjacent vertices, or between a vertex and a center point in one hexagon.

Because the plurality of lower electrodes 120 are arranged in the honeycomb structure as described above, the plurality of lower electrodes 120 may maintain certain gaps between each other. Accordingly, conductive material and upper electrode material may be conformally deposited in a subsequent process, and thus a semiconductor memory device including a capacitor may be realized to show more uniform characteristics and/or performance.

In FIG. 2, the plurality of lower electrodes 120 are illustrated as one circle, unlike two concentric circles illustrated in FIG. 1 for convenience of description. The plurality of lower electrodes 120 may have a certain thickness as illustrated in FIG. 1.

FIGS. 3A through 14B are diagrams for sequentially describing a method of manufacturing the semiconductor device 100 (see FIG. 1), according to an example embodiment of the inventive concepts.

Figure 3A:
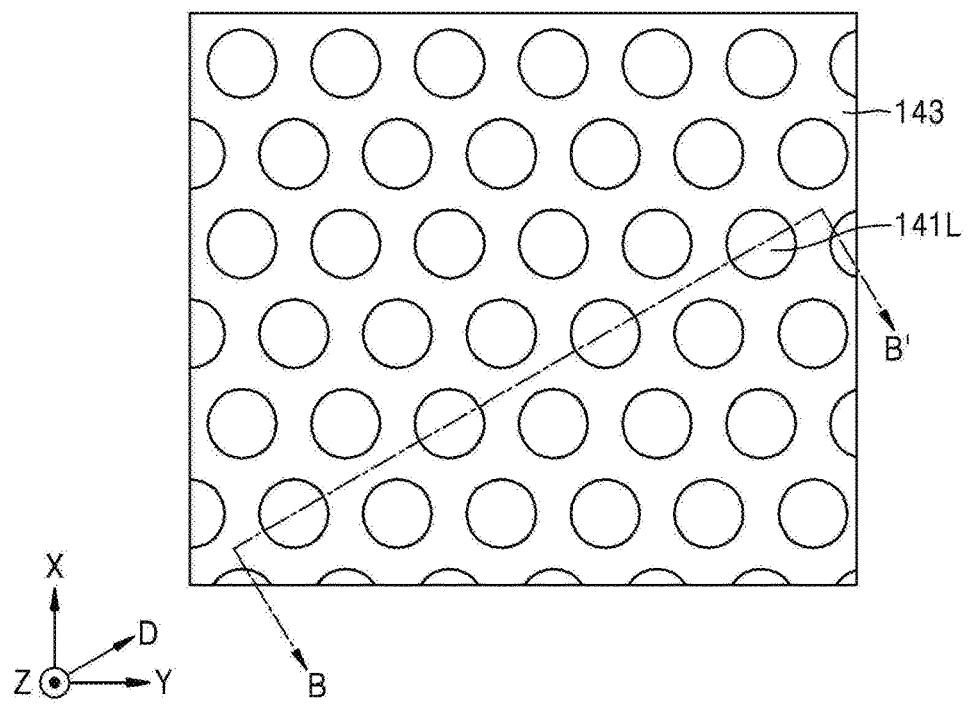
FIGS. 3A through 14B are diagrams for sequentially describing a method of manufacturing a semiconductor device, according to an example embodiment of the inventive concepts.
Figure 3B:
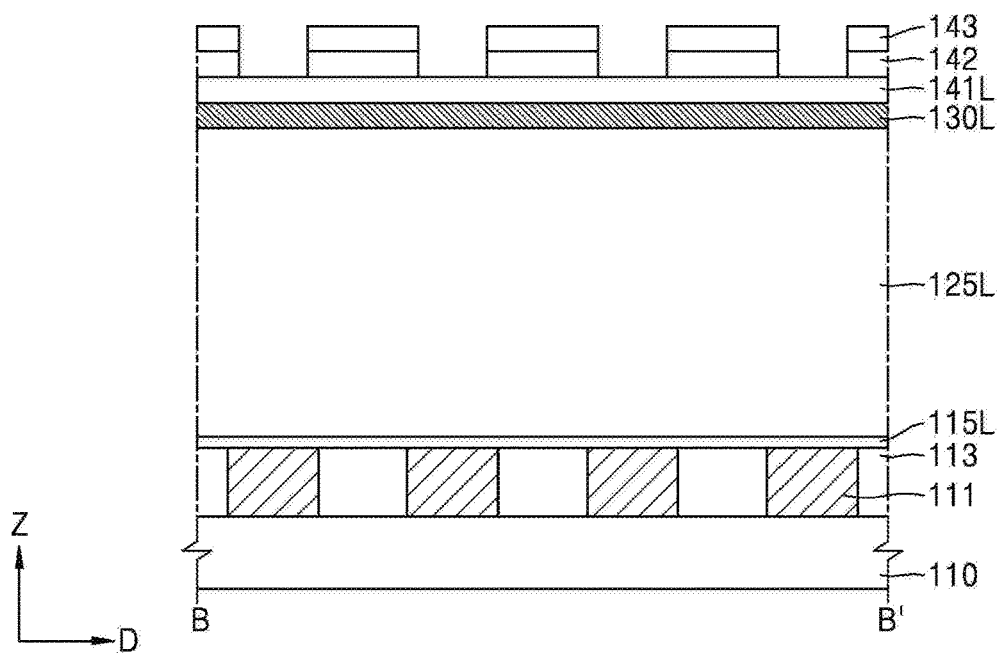
Figure 4A:
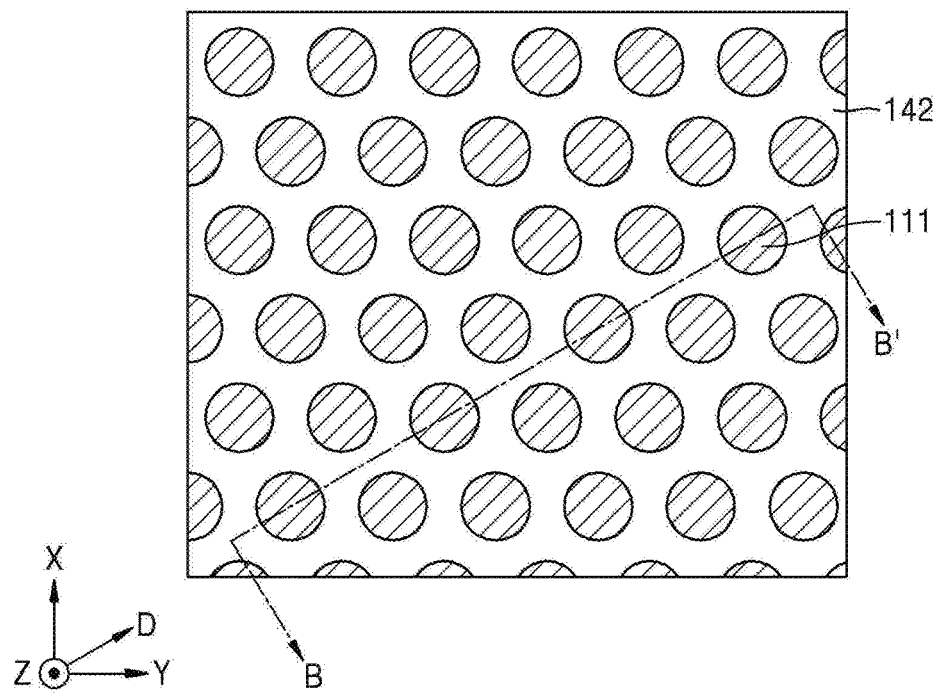
Figure 4B:
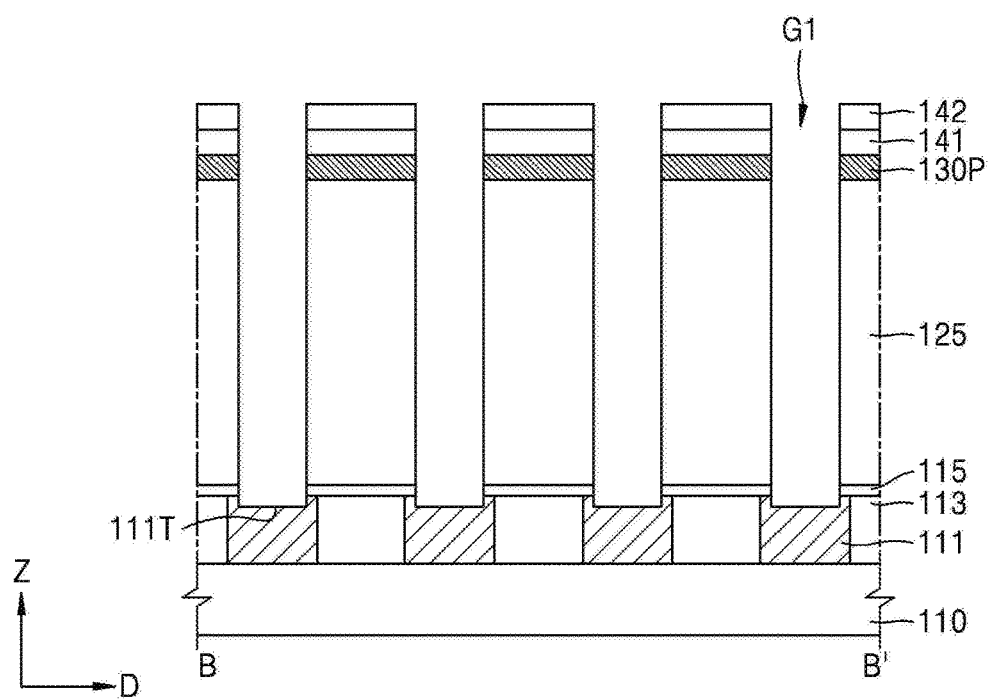

FIGS. 3A, 4A, . . . , and 14A are plan views for sequentially describing the method of manufacturing the semiconductor device 100. FIGS. 3B, 4B, . . . , and 14B are cross-sectional views taken along lines B-B' of FIGS. 3A, 4A, . . . , and 14A in a fourth direction (e.g., a D-direction), respectively.

Referring to FIGS. 3A and 3B, a contact plug 111 may be formed in an interlayer insulating layer 113 on a semiconductor substrate 110, an etching prevention layer 115L may be formed on the contact plug 111 and the interlayer insulating layer 113, and a mold layer 125L may be formed on the etching prevention layer 115L.

The semiconductor substrate 110 may include a semiconductor (e.g., silicon (Si) or germanium (Ge)). In some example embodiments, the semiconductor substrate 110 may include a compound semiconductor material (e.g., silicon germanium (SiGe), silicon carbide (SiC), gallium arsenide (GaAs), indium arsenide (InAs), or indium phosphide (InP)). In other example embodiments, the semiconductor substrate 110 may have a silicon on insulator (SOI) structure. The semiconductor substrate 110 may include a conductive region (e.g., a well doped with an impurity or a structure doped with an impurity). Further, the semiconductor substrate 110 may have various device isolation structures (e.g., a shallow trench isolation (STI) structure).

The mold layer 125L may include an oxide layer. For example, the mold layer 125L may use a material such as borophosphosilicate glass (BPSG), spin on dielectric (SOD), phosphosilicate glass (PSG), low pressure tetra ethyl ortho silicate (LP-TEOS), or plasma enhanced tetra ethyl ortho silicate (PE-TEOS). A thickness of the mold layer 125L may range from about 500 nm to about 4000 nm. However, example embodiments are not limited thereto.

Thereafter, a support forming layer 130L may be formed on the mold layer 125L. The support forming layer 130L may be a material constituting a structure to prevent a collapse of a lower electrode in a subsequent wet etching process, Thus, the support forming layer 130L may include a silicon nitride layer or a polysilicon layer. A thickness of the support forming layer 130L may range from about 20 nm to about 150 nm. However, example embodiments are not limited thereto.

Thereafter, a first sacrificial layer 141L may be formed on the support forming layer 130L. For example, the first sacrificial layer 141L may include materials such as tetra ethyl ortho silicate (TEOS), BPSG, PSG, un-doped silicate glass (USG), SOD, and high density plasma oxide (HDP). A thickness of the first sacrificial layer 141L may range from about 50 nm to about 200 nm. However, example embodiments are not limited thereto.

A second sacrificial layer may be formed on the first sacrificial layer 141L, photoresist may be coated on the second sacrificial layer and patterned via exposing and developing to form a photoresist pattern 143. An open area (or open areas), in which a plurality of lower electrodes are to be formed, may be defined by the photoresist pattern 143. For example, the second sacrificial layer may use a material such as oxide, silicon nitride, silicon oxynitride, or polysilicon. Further, anti-reflection coating (ARC) (not shown) may be formed on the second sacrificial layer.

Thereafter, a second sacrificial pattern 142 may be formed by etching the second sacrificial layer by using the photoresist pattern 143 as an etching mask. When the ARC is formed on the second sacrificial layer, the ARC also may be etched to form an anti-reflection pattern.

Referring to FIGS. 4A and 4B, after the photoresist pattern 143 (see FIG. 3B) has been removed, the first sacrificial layer 141L (see FIG. 3B), the support forming layer 130L (see FIG. 3B), the mold layer 125L (see FIG. 3B), and the etching prevention layer 115L (see FIG. 3B) may be sequentially etched by using the second sacrificial pattern 142 as an etching mask.

Accordingly, a plurality of open holes G1 may be formed and an upper surface of the contact plug 111 may be exposed via the open hole G1. The first sacrificial layer 141L may become the first sacrificial pattern 141, the support forming layer 130L may become the support structure pattern 130P, the mold layer 125L may become the mold pattern 125, and the etching prevention layer 115L may become the etching prevention pattern 115 via etching.

When the mold layer 125L is dry etched, the plurality of open holes G1 may have a shape wherein a lower diameter is less than an upper diameter. For convenience of description, FIG. 4B illustrates the plurality of open holes G1 to have a vertical shape. In some example embodiments, a groove 111T may be formed in an upper surface of the contact plug 111 via excessive etching. In other example embodiments, the groove 111T may not be formed in the upper surface of the contact plug 111.

Figure 5A:
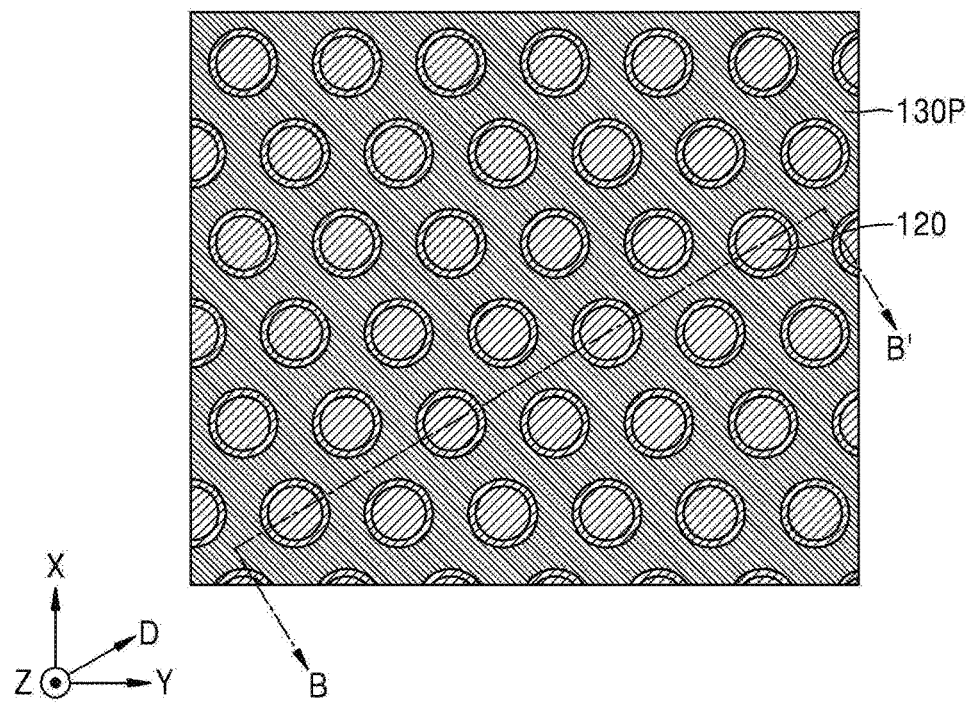
Figure 5B:
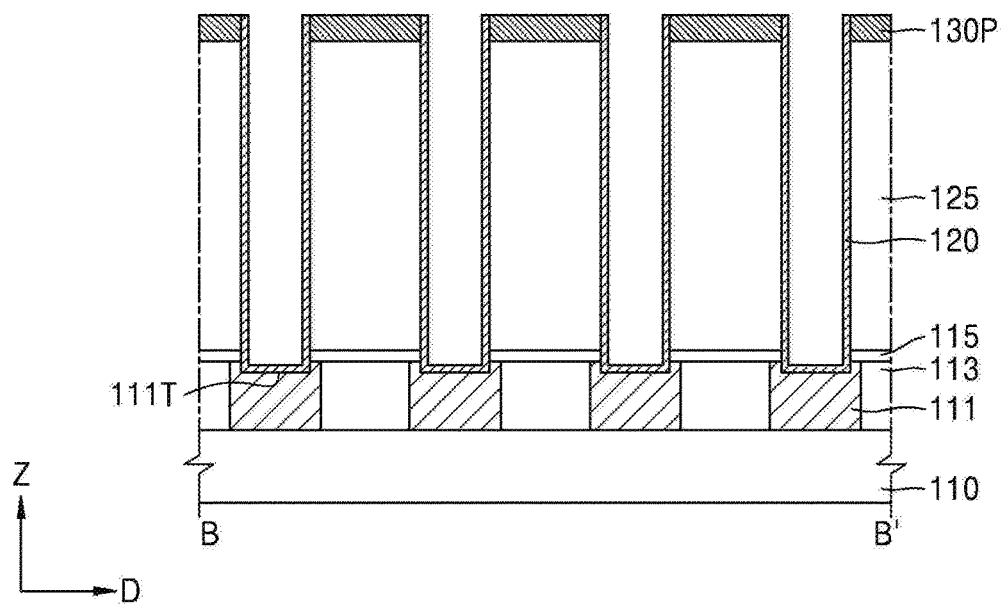

Referring to FIGS. 5A and 5B, after the second sacrificial pattern 142 (see FIG. 4B) has been removed, a conductive material to function as a lower electrode may be conformally formed on an entire surface of a resultant structure. Thereafter, a node separation process may be performed to form the plurality of lower electrodes 120 along lower and side surfaces of the open hole G1 (see FIG. 4B).

The conductive layer to become the plurality of lower electrodes 120 may include any one of a metal nitride layer, a metal layer, or a combination of the metal nitride layer and the metal layer. For example, the conductive layer may include any one of titanium nitride (TiN), ruthenium (Ru), tantalum nitride (TaN), tungsten nitride (WN), platinum (Pt), or iridium (Ir). The conductive layer may be deposited via a chemical vapor deposition (CVD) method or an atomic layer deposition (ALD) method with, for example, a thickness ranging from about 20 nm to about 100 nm.

The node separation process may remove the first sacrificial pattern 141 via etchback or chemical mechanical polishing (CMP). The first sacrificial pattern 141 may protect the support structure pattern 130P during the node separation process.

The adjacent lower electrodes 120 may be insulated and separated from each other by the mold pattern 125. When the shape of the open hole G1 has a shape such that the lower diameter is less than the upper diameter, the shape may be transcribed to the plurality of lower electrodes 120. Thus, the plurality of lower electrodes 120 may have a shape such that the lower diameter is less than the upper diameter.

Bottom portions of the plurality of lower electrodes 120 may be securely formed in the groove 111T at a surface of the contact plug 111, and thus make a solid contact with the contact plug 111. Sidewalls of upper portions of the plurality of lower electrodes 120 may be fixed and supported by the support structure pattern 130P.

Figure 6A:
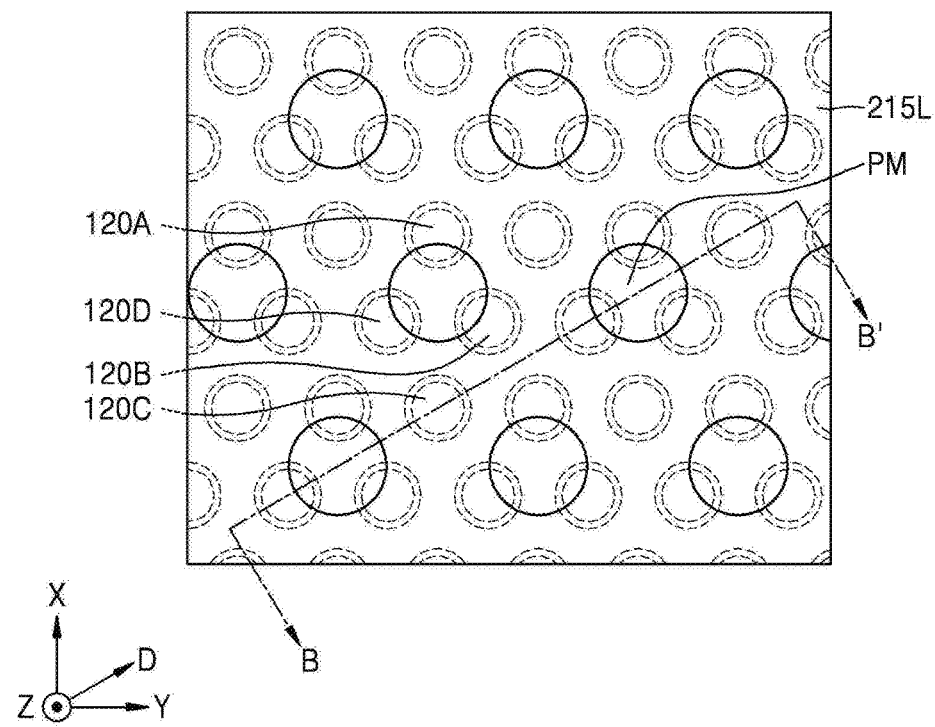
Figure 6B:
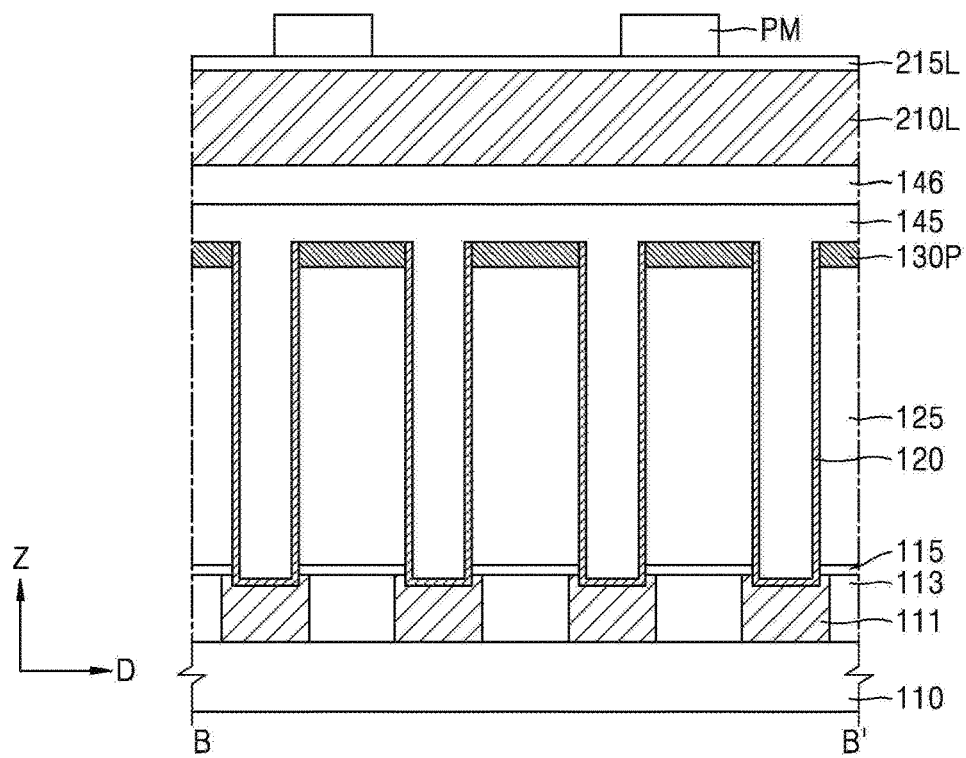

Referring to FIGS. 6A and 6B, a third sacrificial layer 145 may be formed on all surfaces of the plurality of lower electrodes 120 and the support structure pattern 130P, and then a fourth sacrificial layer 146 may be formed on the third sacrificial layer 145. Thereafter, a first hard mask layer 210L may be formed on the fourth sacrificial layer 146, an ARC 215L may be formed on the first hard mask layer 210L, and then a photomask pattern PM may be formed on the ARC 215L.

For example, the third sacrificial layer 145 may include oxide layers such as TEOS, BPSG, PSG, USG, SOD, and HDP. Further, the fourth sacrificial layer 146 may include a silicon oxide layer, a silicon nitride layer, a silicon oxynitride layer, or a polysilicon layer. The fourth sacrificial layer 146 may include a material having a etch selectivity different from that of the third sacrificial layer 145.

The first hard mask layer 210L may include a material having a sufficient etch selectivity with a spacer layer 220L (see FIG. 8B) that will be described below. However, the first hard mask layer 210L is not particularly limited thereto. For example, the first hard mask layer 210L may include a carbon-based material. In some example embodiments, the first hard mask layer 210L may be an amorphous carbon layer (ACL) or a spin-on hard mask (SOH) including a hydrocarbon compound having a relatively high carbon content from about 85 wt % to about 99 wt % with respect to a total weight content of carbon or derivatives of the hydrocarbon compound.

The ARC 215L may include inorganic ARC, an organic ARC, or a combination thereof. The ARC 215L may absorb light reflected from a surface or an interface of the first hard mask layer 210L or offset the light by using an interference effect during a photolithography process for forming the photomask pattern PM. In some example embodiments, the ARC 215L may be omitted.

The photoresist may be patterned via exposing and developing to form the photomask pattern PM. In this regard, a region in which a first support pattern 130A (see FIG. 13B) is to be formed may be defined by the photomask pattern PM.

The photomask pattern PM may have a circular shape formed on (or vertically overlapping) a part of each of three adjacent lower electrodes 120A, 120B, and 120D and may be arranged in the first direction (the X-direction) and the second direction (the Y-direction) in parallel to an upper surface of the semiconductor substrate 110 to form rows and columns. The photomask pattern PM on any one row may be misaligned relative to the photomask pattern PM on another adjacent row. Also, the photomask pattern PM may not be formed on some of the lower electrodes 120C.

As the integration of a semiconductor device increases, the design rule of components of the semiconductor device tends to decrease. Due to technical limitations of a photolithography process in a highly scaled semiconductor device, it is very difficult to repeatedly form the photomask patterns PM to be on (or to vertically overlap) parts of all the lower electrodes 120.

However, according to an example embodiment, the method of manufacturing the semiconductor device 100 may form the support structure 130 including the plurality of open areas OP that expose all the lower electrodes 120 by using a given photolithography process even though the photomask patterns PM are not formed on some of the lower electrodes 120C.

Figure 7A:
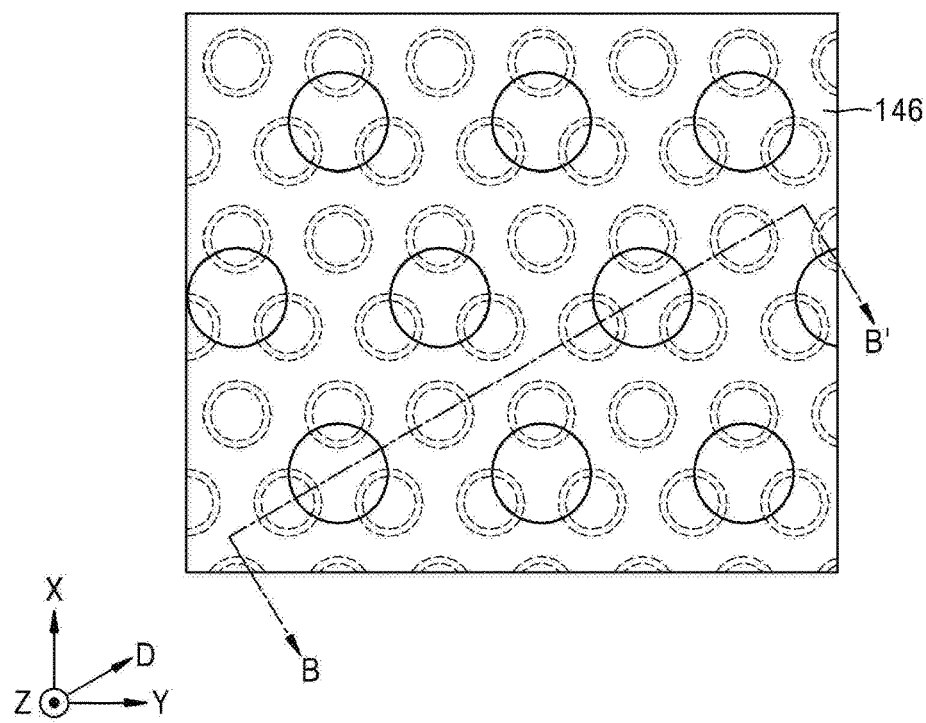
Figure 7B:
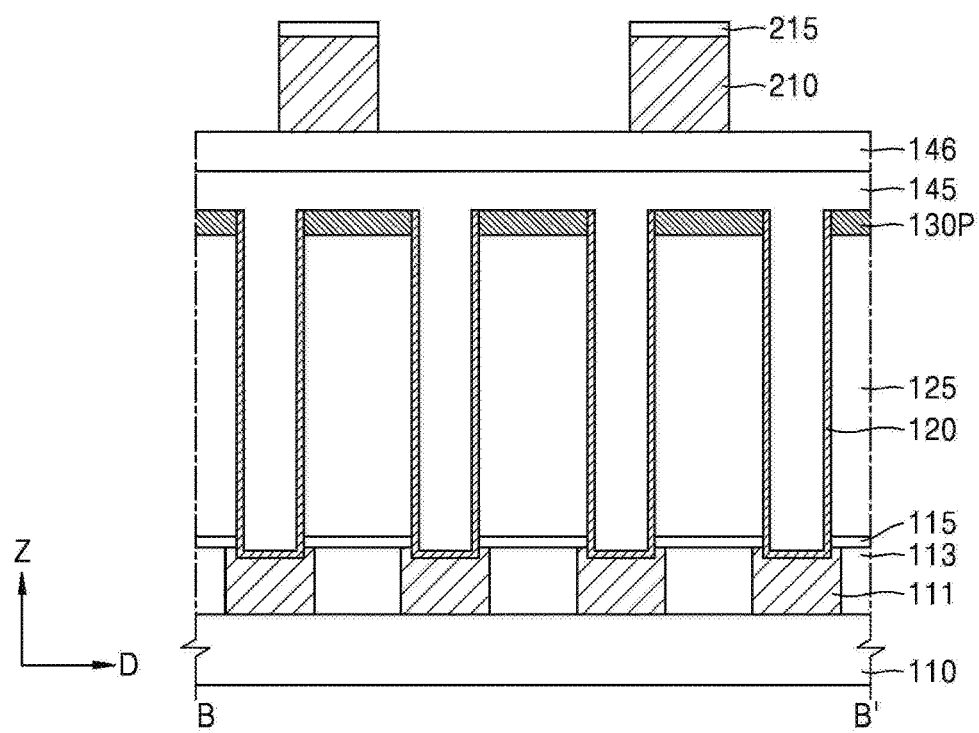

Referring to FIGS. 7A and 7B, the ARC 215L (see FIG. 6B) and the first hard mask layer 210L (see FIG. 6B) may be etched by using the photomask pattern PM as an etching mask. Accordingly, the ARC 215L may become an anti-reflection pattern 215, the first hard mask layer 210L may become a first hard mask pattern 210, and an upper surface of the fourth sacrificial layer 146 may be exposed.

The photomask pattern PM (see FIG. 6B) may be removed by using ashing and stripping processes. The process of removing the photomask pattern PM may be performed under a condition that etching of the first hard mask pattern 210 and the fourth sacrificial layer 146 are inhibited.

Figure 8A:
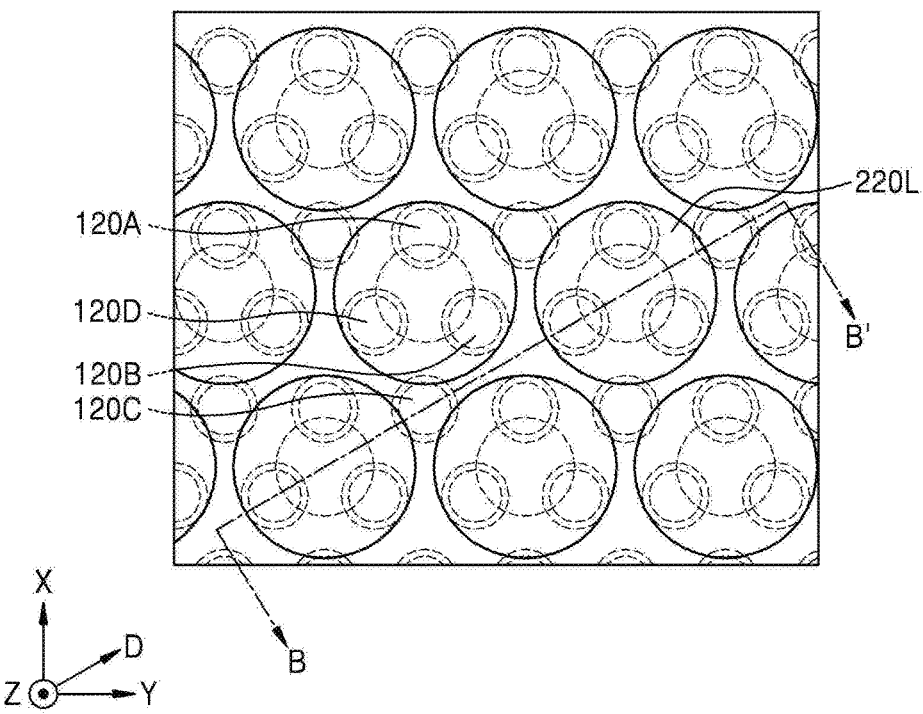
Figure 8B:
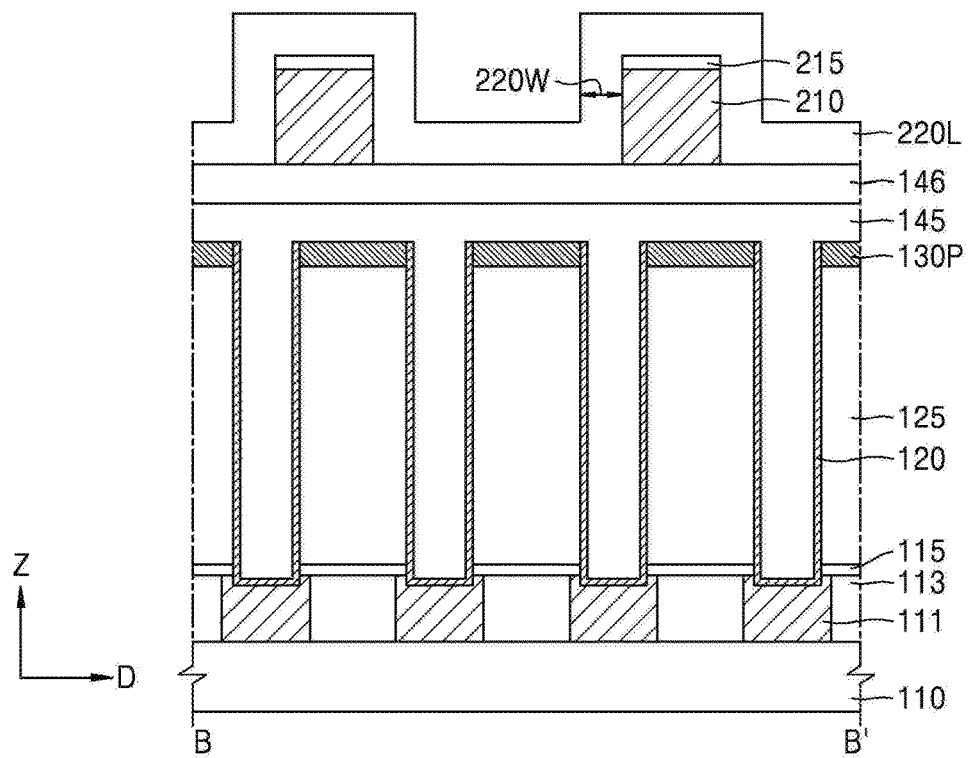

Referring to FIGS. 8A and 8B, the spacer layer 220L may be conformally formed on exposed surfaces of the anti-reflection pattern 215 and the first hard mask pattern 210 and the upper surface of the fourth sacrificial layer 146.

The spacer layer 220L may be formed, for example, by CVD or ALD, but example embodiments are not limited thereto. The spacer layer 220L may include a material having etch selectivity with the first hard mask pattern 210, however, example embodiments are not particularly limited thereto. For example, the spacer layer 220L may include a silicon oxide layer, a silicon nitride layer, or a silicon oxynitride layer.

A width 220W of the spacer layer 220L may be formed such that the spacer layer 220L may cover all upper portions of the three adjacent lower electrodes 120A, 120B, and 120D and may include at least a part of the upper portion of some of the lower electrodes 120C on which the photomask pattern PM (see FIG. 6B) is not formed. In this regard, a region in which the plurality of open areas OP (see FIG. 13A) are to be formed may be defined by a region constituting the width 220W of the spacer layer 220L.

Figure 9A:
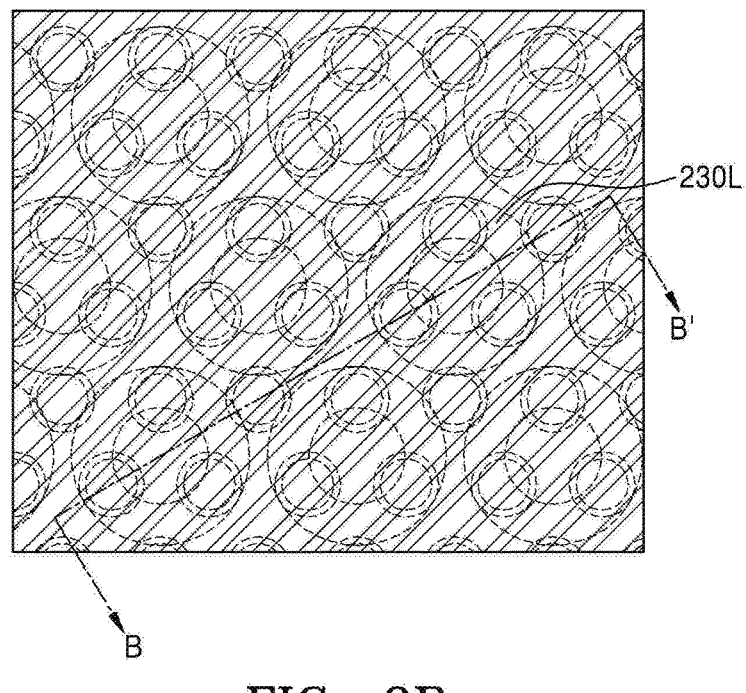
Figure 9B:
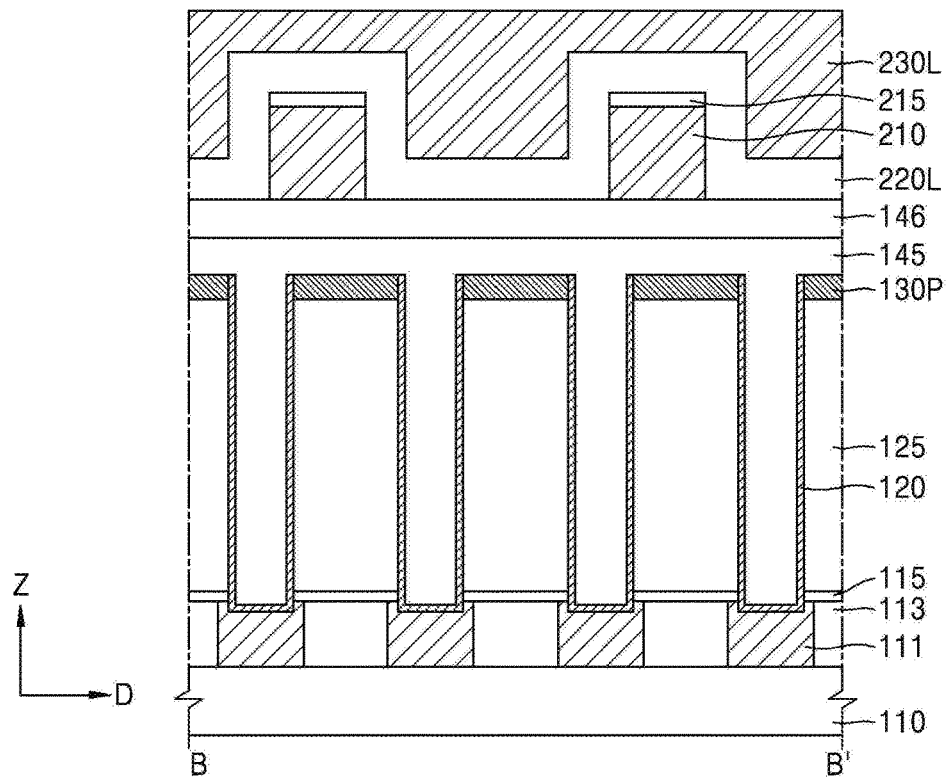

Referring to FIGS. 9A and 9B, a second hard mask layer 230L may be formed to have a flat upper surface on an entire surface of the spacer layer 220L.

The second hard mask layer 230L may include a material having a etch selectivity with the spacer layer 220L. For example, the second hard mask layer 230L may include the same material as the first hard mask layer 210L.

In some example embodiments, to form the second hard mask layer 230L on the spacer layer 220L to have such flat upper surface, a composition of the second hard mask layer 230L may be manufactured as a solution and coated on the spacer layer 220L by spin-on coating.

Accordingly, the second hard mask layer 230L may totally cover the spacer layer 220L including an uneven pattern and have a substantially flat upper surface. However, a method of forming the second hard mask layer 230L is not limited thereto. Further, the level of the upper surface of the second hard mask layer 230L may be higher than that of the upper surface of the spacer layer 220L.

Figure 10A:
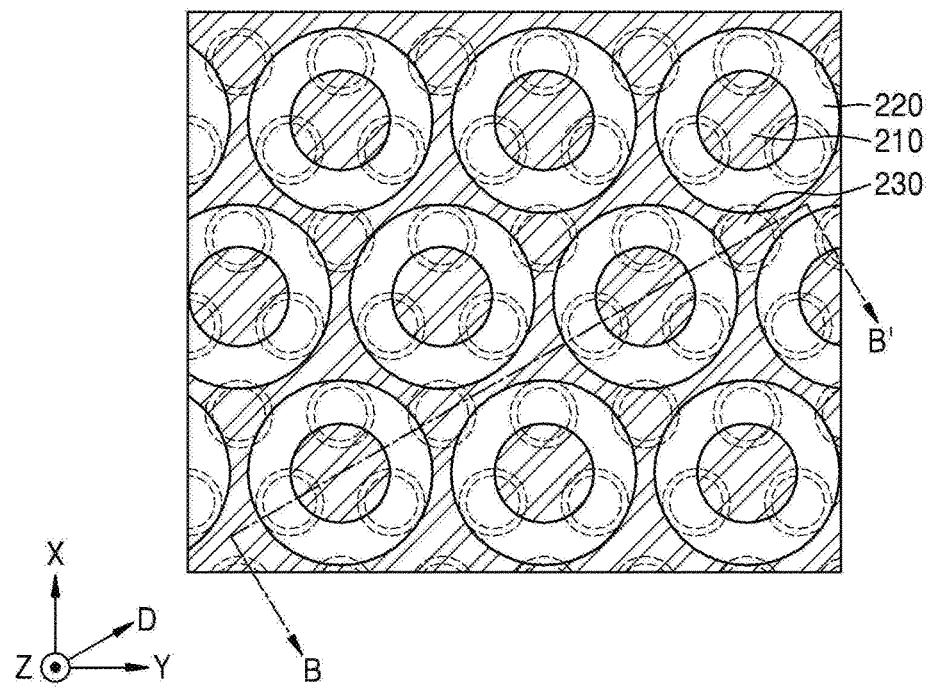
Figure 10B:
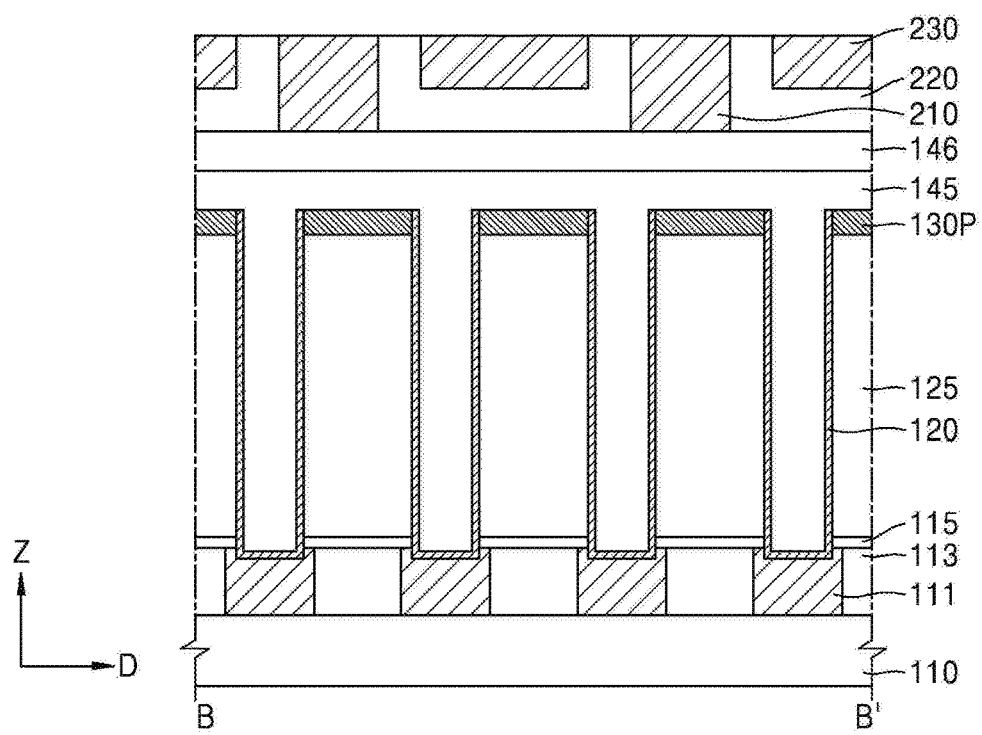

Referring to FIGS. 10A and 10B, all surfaces of the second hard mask layer 230L (see FIG. 9B), the spacer layer 220L (see FIG. 9B), and the anti-reflection pattern 215 (see FIG. 9B) may be etched to form a spacer pattern 220 and a second hard mask pattern 230, and an upper surface of the first hard mask pattern 210 may be exposed.

During an entire surface etching process, the anti-reflection pattern 215 may be removed by using, for example, a CMP technique or an etchback technique. The anti-reflection pattern 215 may protect the first hard mask pattern 210 during the entire surface etching process.

As a result of the entire surface etching process, the first hard mask pattern 210, the spacer pattern 220, and the second hard mask pattern 230 may be exposed. As described above, when the first hard mask pattern 210 and the second hard mask pattern 230 include same carbon-based materials, a silicon oxide layer constituting the spacer pattern 220 may be disposed between the carbon-based materials. That is, at least two materials having different etch selectivities may be formed on the fourth sacrificial layer 146.

Figure 11A:
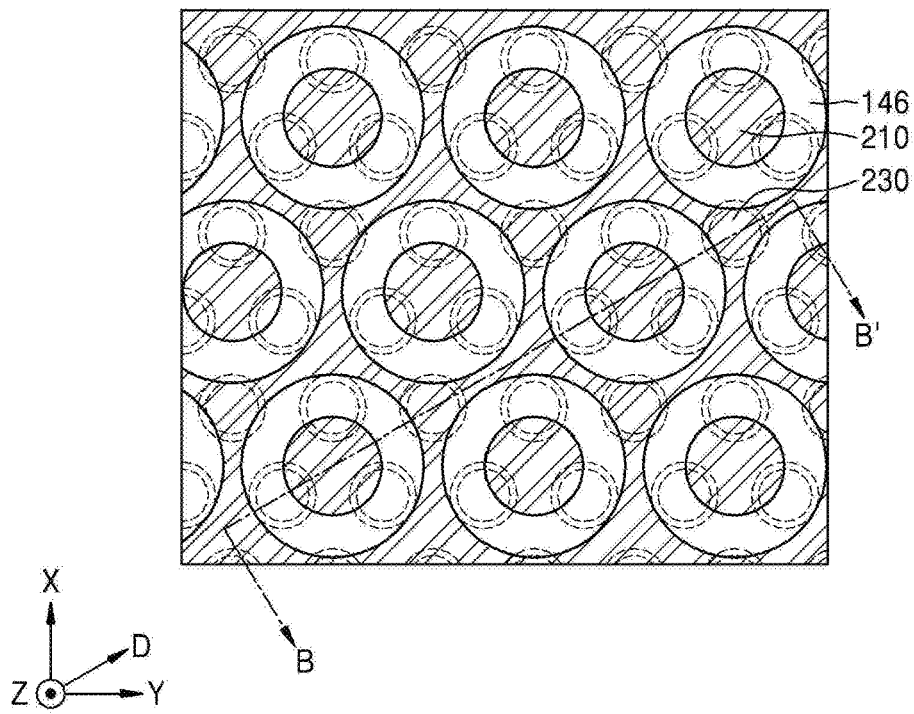
Figure 11B:
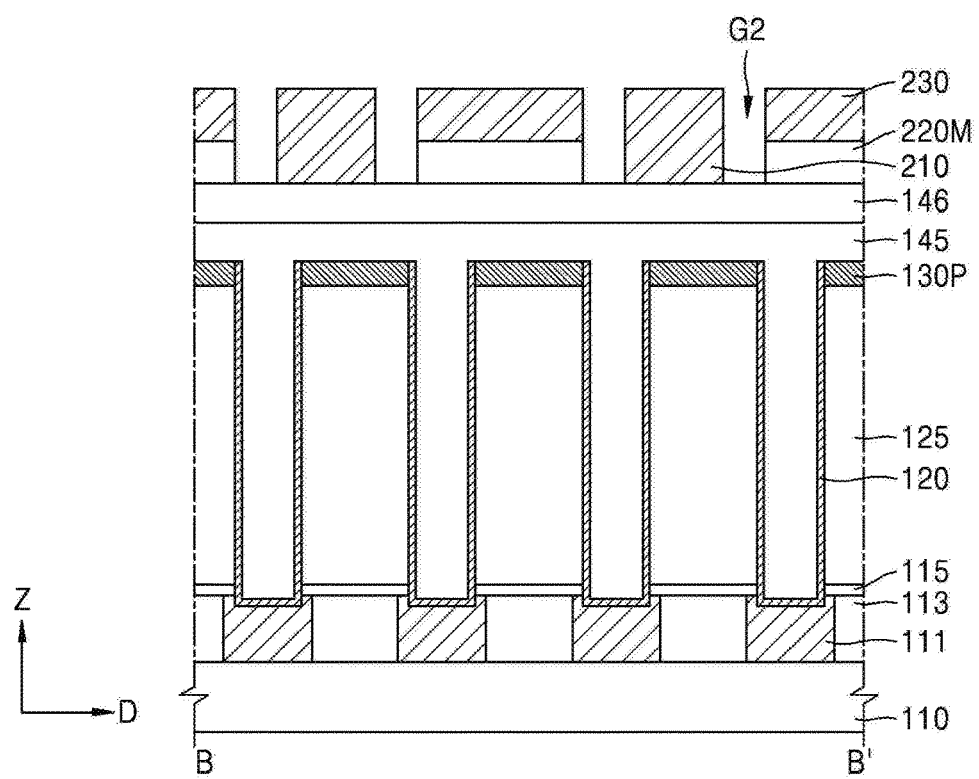

Referring to FIGS. 11A and 11B, the exposed spacer pattern 220 may be etched to form a lower spacer pattern 220M and open holes G2 that expose an upper surface of the fourth sacrificial layer 146.

An externally exposed part of the spacer pattern 220 may be etched by using etch selectivity between materials constituting the first hard mask pattern 210 and the second hard mask pattern 230 and a material constituting the spacer pattern 220 (see FIG. 10B) to expose the upper surface of the fourth sacrificial layer 146.

The spacer pattern 220 may be etched under a condition that etching of the first hard mask pattern 210 and the second hard mask pattern 230 is inhibited. Thus, an etching mask including the first hard mask pattern 210 and the second hard mask pattern 230 may be formed by performing a photolithography process once.

That is, the etching mask including the first hard mask pattern 210 and the second hard mask pattern 230 which may expose all the lower electrodes 120 may be formed by using a given photolithography process.

Figure 12A:
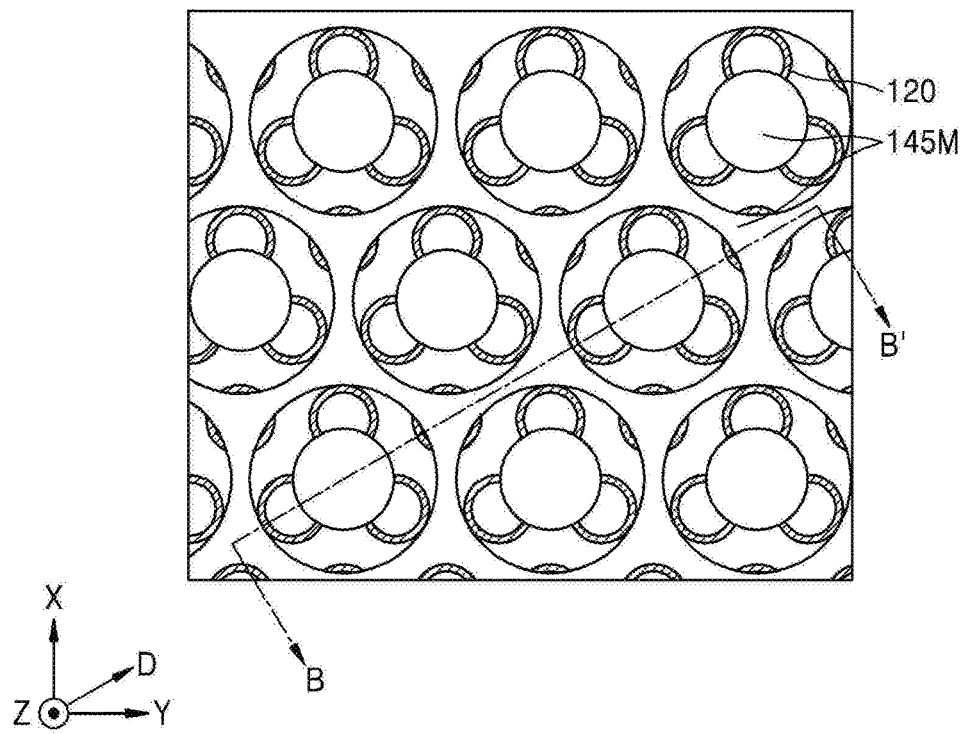
Figure 12B:
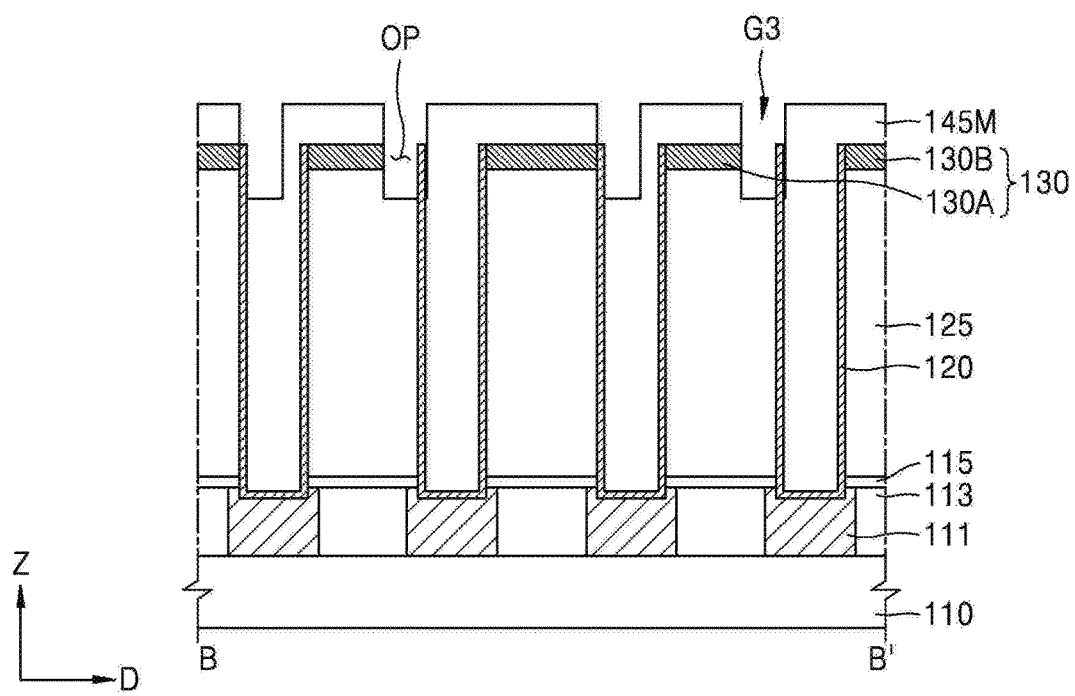

Referring to FIGS. 12A and 12B, the fourth sacrificial layer 146 (see FIG. 11B) may be etched by using the first hard mask pattern 210 (see FIG. 11B) and the second hard mask pattern 230 (see FIG. 11B) as the etching mask. Thereafter, the third sacrificial layer 145 may be etched by using the fourth sacrificial layer 146 as the etching mask and the support structure pattern 130P (see FIG. 11B) may be partially etched to form the support structure 130 including the open area OP.

Thereafter, the fourth sacrificial layer 146 may be removed, and the third sacrificial layer 145 may become a third sacrificial pattern 145M including open holes G3. Also, when the support structure pattern 130P is etched, parts of surfaces of the plurality of lower electrodes 120 may be exposed.

As described above, the plurality of open holes G3 and the open area OP may be formed, and thus a sufficient space for infiltration of a wet etchant during a subsequent wet etching process may be formed. In the semiconductor device 100 according to an example embodiment, the support structure 130 including the open area OP may have a structure facilitating easy infiltration of the wet etchant during the wet etching process as well as a structure providing a diffusion path of source gas and reaction gas during a the dielectric layer forming process that will be described below.

That is, in the semiconductor device 100 according to an example embodiment, each of the plurality of lower electrodes 120 may be entirely or partially exposed by the open area OP, and thus the wet etching process may be smoothly performed, and/or step coverage of the dielectric layer formed by the dielectric layer forming process may be improved.

When the support structure pattern 130P is partially etched, the open area OP may be appropriately secured. The open area OP may contribute to a subsequent process as described above while maintaining support performance of the support structure 130. If the open area OP is wider or is widened more than desired, the support performance of the support structure 130 may deteriorate. If the open area OP is narrower or is narrowed less than desired, a subsequent wet etching process and the process of forming the dielectric layer may suffer.

Figure 13A:
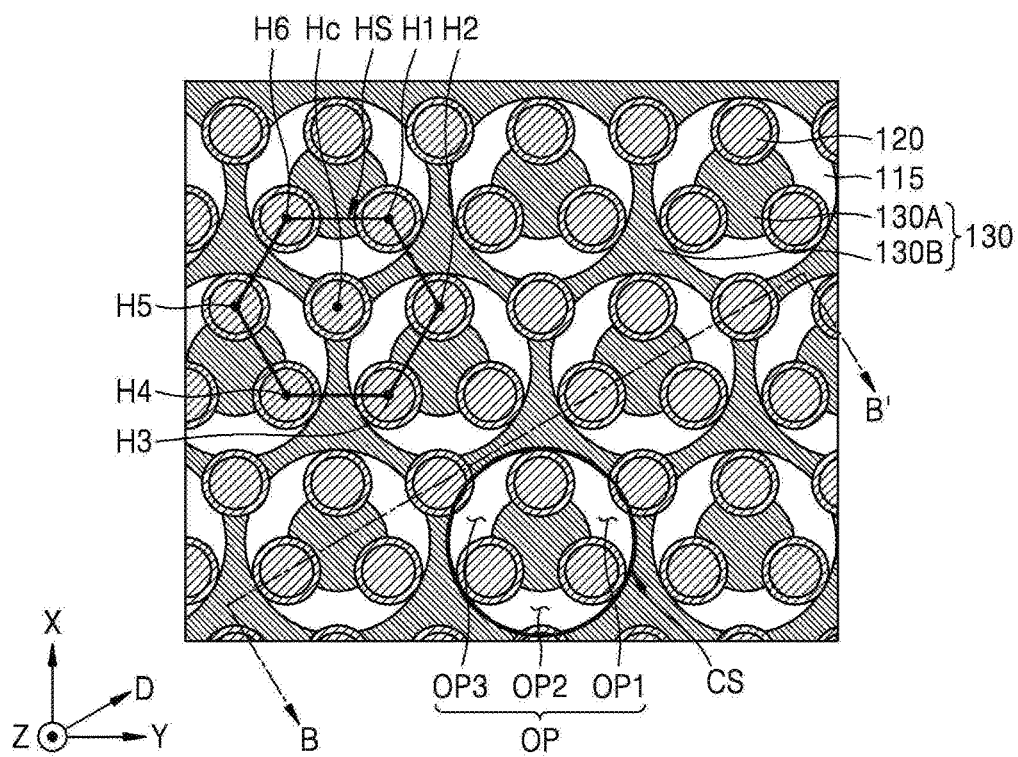
Figure 13B:
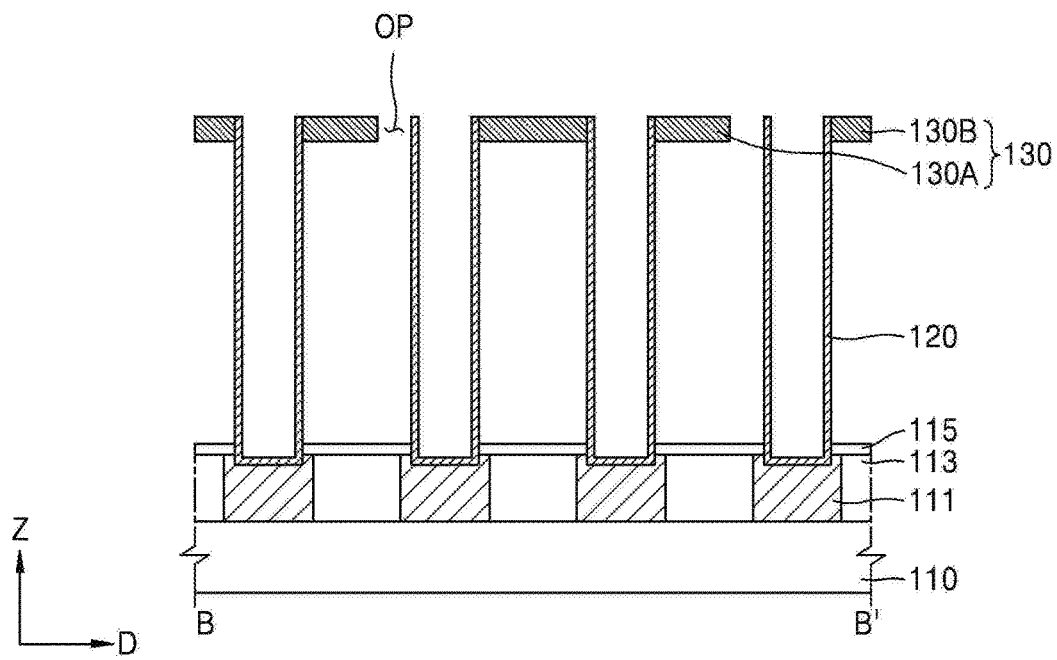

Referring to FIGS. 13A and 13B, both the third sacrificial pattern 145M (see FIG. 12B) and the mold pattern 125 (see FIG. 12B) may be removed through, for example, the wet etching process.

The mold pattern 125 may be configured as the oxide layer. In this case, the wet etching process may be performed by using a wet etchant such as hydrofluoric acid and buffered oxide etchant (BOE) solution. The wet etchant may infiltrate through the open hole G3 (see FIG. 12B) formed in the third sacrificial pattern 145M and the open area OP formed in the support structure 130 and may wet etch the third sacrificial pattern 145M and the mold pattern 125. The third sacrificial pattern 145M may be simultaneously removed during wet etching of the mold pattern 125.

During the wet etching process, the support structure 130 may not be etched and maintain its original structure, and prevent the plurality of lower electrodes 120 from collapsing or fracturing. Further, the etching prevention pattern 115 may prevent the wet etchant from infiltrating into lower portions of the plurality of lower electrodes 120.

Structures of the plurality of lower electrodes 120, the support structure 130, and the plurality of open areas OP will now be described in detail.

As described above, the plurality of lower electrodes 120 may be arranged in a honeycomb structure. The plurality of lower electrodes 120 arranged in the honeycomb structure may be arranged such that six lower electrodes 120 arranged at the vertices H1, H2, H3, H4, H5 and H6 of a hexagon and one lower electrode 120 arranged at the center point Hc of the hexagon configures a first hexagonal structure HS. Each of the lower electrodes 120 arranged at the vertices H1, H2, H3, H4, H5 and H6 of the first hexagonal structure HS may become the lower electrode 120 arranged at center points of different six hexagonal structures. The lower electrode 120 arranged at the center point Hc of the first hexagonal structure HS may be shared as one of the lower electrodes 120 arranged at vertices of the six different hexagonal structures.

The support structure 130 may be formed to connect the plurality of lower electrodes 120 to each other, support the plurality of lower electrodes 120, and define the plurality of open areas OP exposing the plurality of lower electrodes 120. The support structure 130 may be formed in a structure in which three areas of the lower electrode 120 arranged at the center point Hc of the first hexagonal structure HS are exposed by the open areas OP and two areas of the lower electrodes 120 arranged at the vertices H1, H2, H3, H4, H5 and H6 of the first hexagonal structure HS are exposed by the open areas OP. That is, different numbers of areas may be exposed according to locations of the lower electrodes 120.

Also, the support structure 130 may include a first support pattern 130A arranged inside a first circular structure CS defined by a virtual line enclosing three circularly arranged open areas from among the plurality of open areas OP, and a second support pattern 130B spaced apart from the first support pattern 130A outside the first circular structure CS. The lower electrode 120 arranged at the center point Hc of the first hexagonal structure HS may be in contact with only the second support pattern 130B. The lower electrodes 120 arranged at the vertices H1, H2, H3, H4, H5 and H6 of the first hexagonal structure HS may be in contact with both the first support pattern 130A and the second support pattern 130B.

The first support pattern 130A and the second support pattern 130B may have different shapes. As shown, the first support pattern 130A may have a circular shape, and the second support pattern 130B may have a shape in which three branches extend in a radial direction from a center at an equal angle (e.g., a triangular boomerang shape).

The plurality of open areas OP may have doughnut shapes that are separated into three sub areas OP1, OP2, and OP3. Each of the three sub areas OP1, OP2, and OP3 may expose the three adjacent lower electrodes 120 among the plurality of lower electrodes. An exposed area of one of the three adjacent lower electrodes 120 exposed by one of the three sub areas OP1, OP2, and OP3 may be different from exposed areas of the other two lower electrodes 120. The open areas OP may have the same or substantially similar planar size.

The plurality of open areas OP may constitute the first circular structure CS formed along a virtual line to form a plurality of rows in the first direction (the X-direction) and a plurality of columns in the second direction (the Y-direction). The plurality of open areas OP arranged on a first row, from among the plurality of rows, may be misaligned (e.g., arranged to be not aligned) in the first direction (the X-direction) relative to the plurality of open areas OP arranged on a second row, from among the plurality of rows, adjacent to the first row.

Further, the six adjacent lower electrodes 120 that are at least partially included in an area exposed by the first circular structure CS may include the three lower electrodes 120 arranged inside the first circular structure CS and the other three lower electrodes 120 arranged outside the first circular structure CS. Exposed areas of three lower electrodes 120 arranged inside the first circular structure CS and exposed areas of the other three lower electrodes 120 arranged outside the first circular structure CS may be different from each other.

A diameter of the first support pattern 130A may be greater than that of each of the plurality of lower electrodes 120. A diameter of the first circular structure CS may be greater than that of the first support pattern 130A. A center point of the first circular structure CS and a center point of the first support pattern 130A may be identical to each other.

As a result, the plurality of open areas OP may be arranged in a structure in which all the plurality of lower electrodes 120 are exposed. The semiconductor device 100 (see FIG. 1) according to an example embodiment may include the support structure 130 including the plurality of open areas OP exposing the six lower electrodes 120 in order to support the plurality of lower electrodes 120, thereby implementing the lower electrode 120 having a high exposure ratio.

Accordingly, a subsequent process may be smoothly performed, and thus a reliable semiconductor device may be implemented. Furthermore, performance of a capacitor may be enhanced, and performance of the semiconductor device may be enhanced. A process of manufacturing the semiconductor device according to an example embodiment may form the support structure 130 including the plurality of open areas OP that may expose all the lower electrodes 120 by performing a photolithography process once.

Figure 14A:
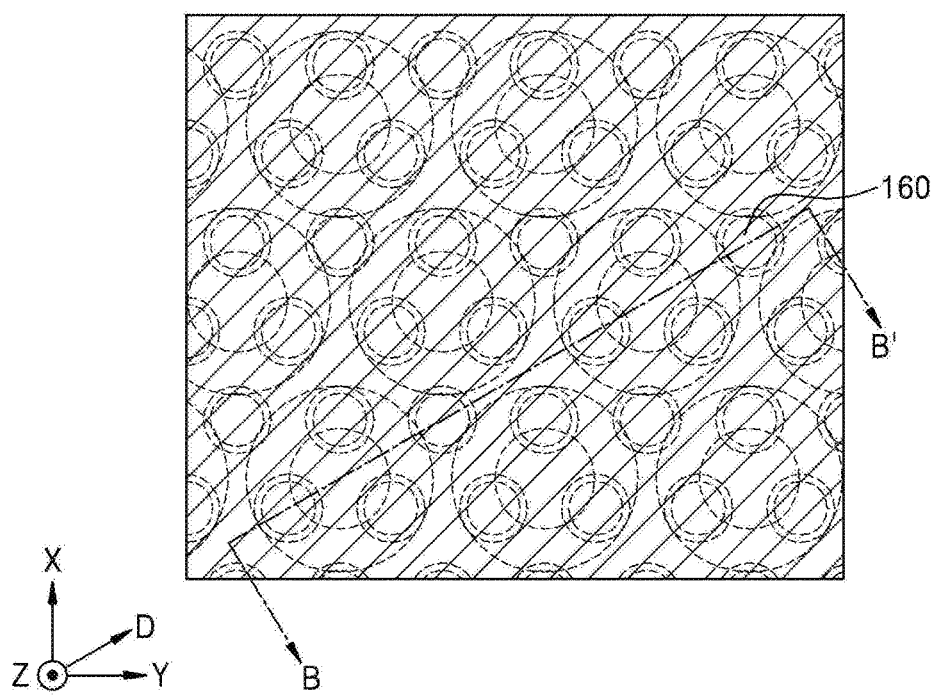
Figure 14B:
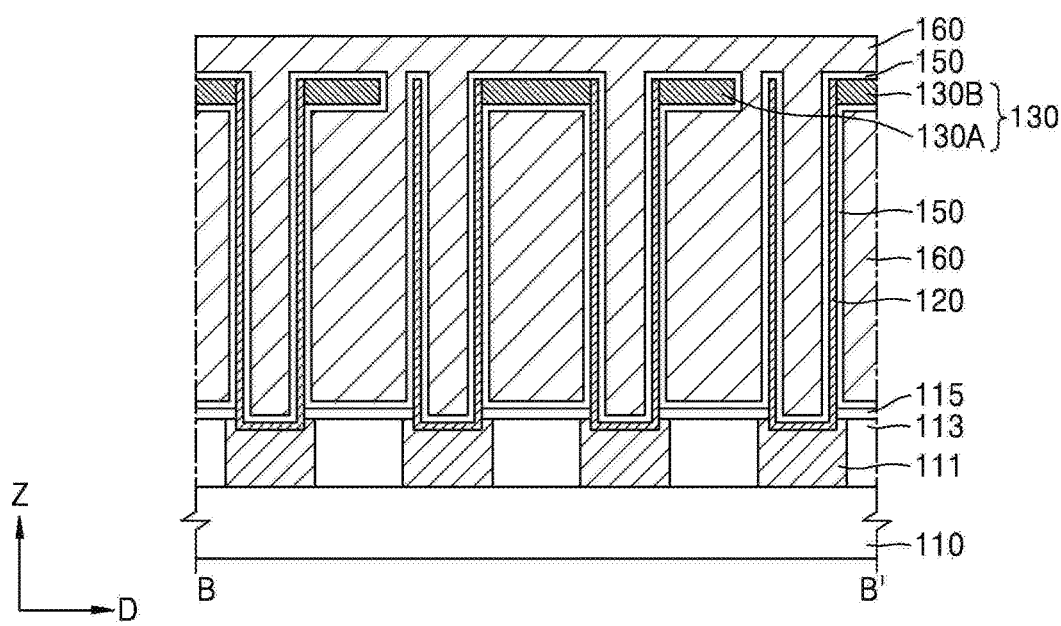

Referring to FIGS. 14A and 14B, the dielectric layer 150 may be formed to conformally cover the plurality of lower electrodes 120 and the support structure 130 and the upper electrode 160 may be formed on an entire surface of the dielectric layer 150.

Source gas and reaction gas may be supplied through the open area OP (see FIG. 13B) formed in the support structure 130, and thus the dielectric layer 150 and the upper electrode 160 may be formed in a relatively smooth and/or uniform manner.

The dielectric layer 150 may be conformally formed along surfaces of the plurality of lower electrodes 120, a surface of the support structure 130, and an upper surface of the etching prevention pattern 115. The dielectric layer 150 may include at least one selected from the group consisting of a silicon oxide layer, a silicon nitride layer, a silicon oxynitride layer, and a high-k dielectric layer. The dielectric layer 150 may electrically separate the plurality of lower electrodes 120 from the upper electrode 160 formed during a subsequent process to allow the plurality of lower electrodes 120 and the upper electrode 160 to function as a capacitor.

The upper electrode 160 may entirely fill areas from which the mold pattern 125 (see FIG. 12B) and the third sacrificial layer 145M (see FIG. 12B) are removed. A conductive material constituting the upper electrode 160 may include any one of a metal nitride layer, a metal layer, or a combination of the metal nitride layer and the metal layer. For example, the conductive material may include any one selected from the group consisting of TiN, Ru, TaN, WN, Pt, and Ir. The conductive material may be formed via a CVD method or an ALD method.

Through the above described manufacturing process, the semiconductor device 100 including a capacitor according to an example embodiment may be formed. The capacitor may constitute a memory cell array of the semiconductor device such as DRAM. Although not shown, the semiconductor device 100 may further include a switching array formed below the capacitor. The switching array may include switching transistors respectively connected to the contact plugs 111.

Figure 15:
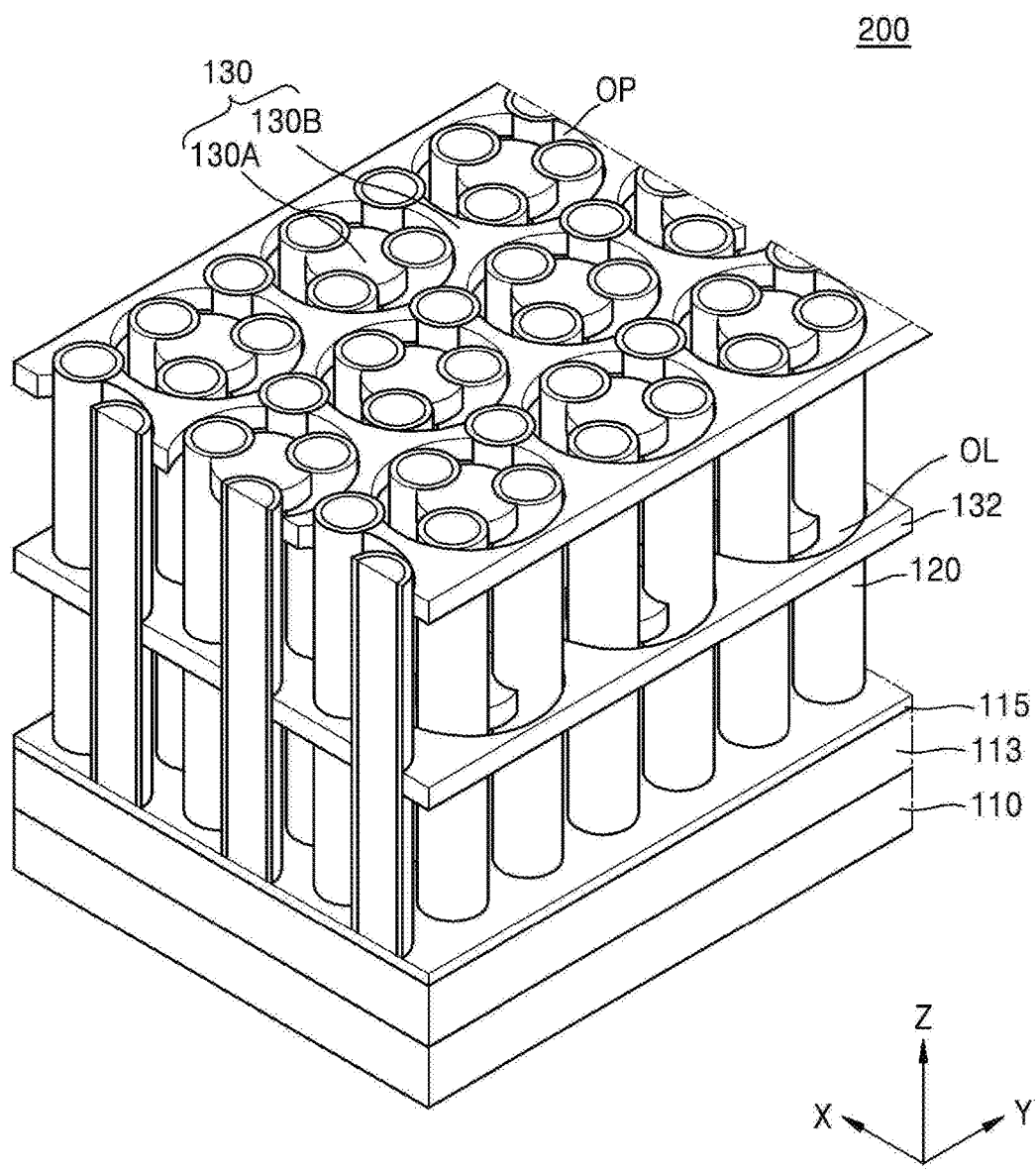
FIG. 15 is a schematic perspective view of a plurality of lower electrodes and a support structure of a semiconductor device, according to another example embodiment of the inventive concepts.

FIG. 15 is a schematic perspective view of the plurality of lower electrodes 120 and a support structure of a semiconductor device 200 according to another example embodiment of the inventive concepts.

Referring to FIG. 15, the semiconductor device 200 is the same as or substantially similar to the semiconductor device 100 of FIG. 1 except for a lower support structure 132. Thus, a detailed description of the same or similar features will not be repeated here for brevity of explanation.

The semiconductor device 200 may further include the lower support structure 132. That is, the semiconductor device 200 may further include the lower support structure 132 formed lower than the support structure 130, in addition to the support structure 130 including the open area OP.

The lower support structures 132 may be formed between the plurality of lower electrodes 120, and may be in contact with at least some of the plurality of lower electrodes 120.

In some example embodiments, the lower support structures 132 may be in contact with at least portions of the plurality of lower electrodes 120 at a height lower than ½ of an entire height of the plurality of lower electrodes 120. The support structure 130 may be in contact with at least upper side portions of the plurality of lower electrodes 120. Upper surfaces of the support structures 130 may have the same or substantially similar height as those of upper surfaces of the plurality of lower electrodes 120. In correspondence to the support structure 130 including the open area OP, the lower support structure 132 may include a lower open area OL. In some example embodiments, the open area OP and the lower open area OL may at least partially overlap in a third direction (a Z-direction).

The lower support structure 132 may include an insulating layer, for example, silicon oxide, silicon nitride, or silicon oxynitride, and may include the same material as the support structure 130.

In some example embodiments, widths of upper portions of the plurality of lower electrodes 120 may be greater than those of lower portions thereof. Accordingly, spaced distances between the lower portions of the plurality of lower electrodes 120 may be greater than spaced distances between the upper portions thereof. Thus, widths of the lower support structures 132 between the adjacent lower electrodes 120 may be greater than those of the support structures 130 between the adjacent lower electrodes 120.

The semiconductor device 200 includes the support structure 130 and the lower support structure 132 in FIG. 15 but is not limited thereto. That is, the semiconductor device 200 may include three or more support structures.

Figure 16:
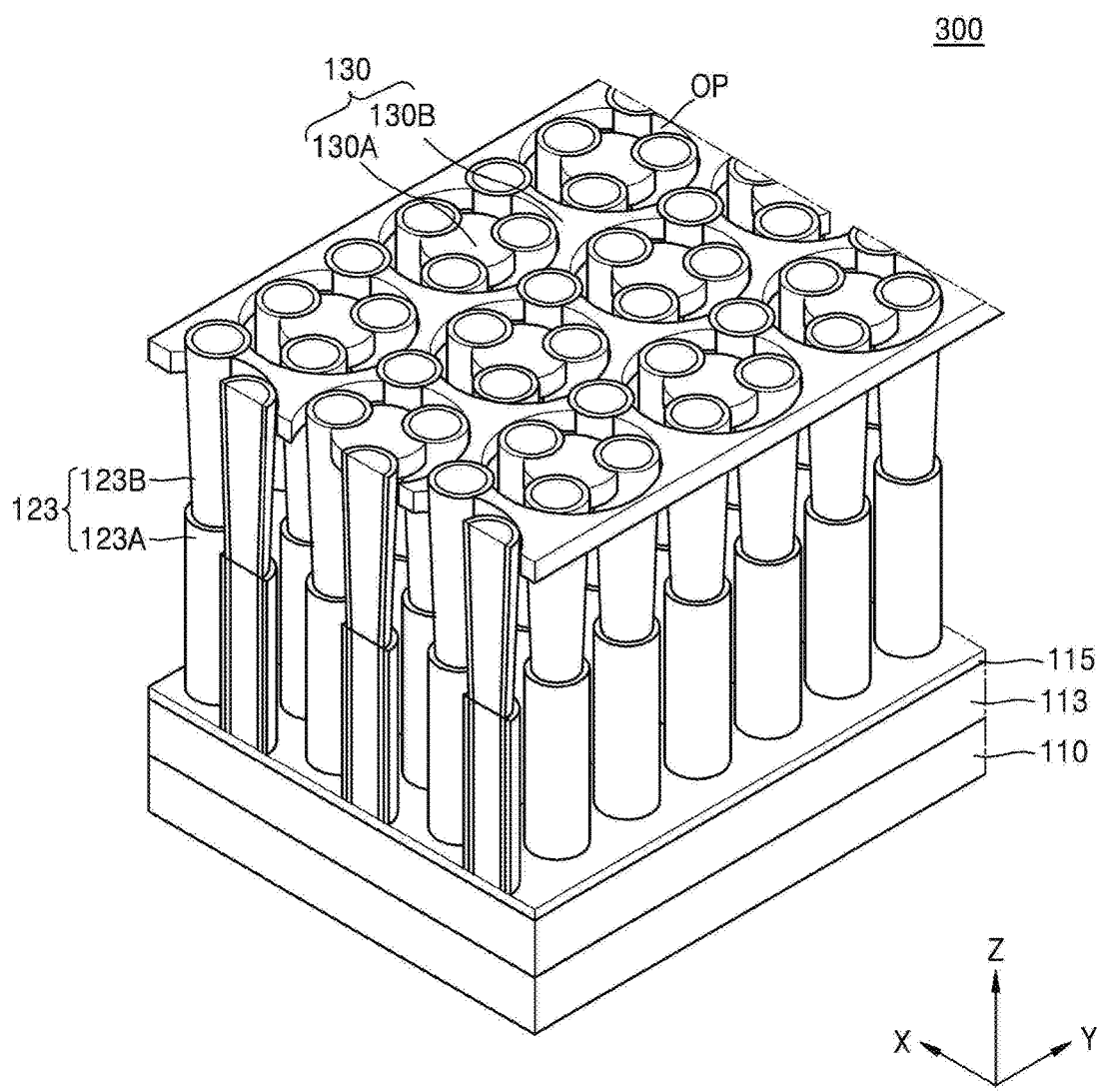
FIG. 16 is a schematic perspective view of a plurality of lower electrodes and a support structure of a semiconductor device, according to another example embodiment of the inventive concepts.

FIG. 16 is a schematic perspective view of a plurality of lower electrodes 123 and the support structure 130 of a semiconductor device 300 according to another example embodiment of the inventive concepts.

Referring to FIG. 16, in the semiconductor device 300, the plurality of lower electrodes 123 respectively connected to the contact plugs 111 (see FIG. 14B) on the interlayer insulating layer 113 of the semiconductor substrate 110 may include two different structures. For example, the plurality of lower electrodes 123 may be formed in a hybrid structure including a pillar type lower electrode 123A and a cylinder type lower electrode 123B.

The semiconductor device 300 is substantially the same as the semiconductor device 100 of FIG. 1 except from the plurality of lower electrodes 123. Thus, a detailed description of the same or similar features will not be repeated here for brevity of explanation.

For example, the lower electrode 123 may have a double layer structure in which the pillar type lower electrode 123A and the cylinder type lower electrode 123B are stacked. A lower surface of the pillar type lower electrode 123A may be supported by the contact plug 111. An upper diameter of the pillar type lower electrode 123A may be greater than a lower diameter of the cylinder type lower electrode 123B. In some example embodiments, the upper diameter of the pillar type lower electrode 123A may be equal to or less than the lower diameter of the cylinder type lower electrode 123B.

A groove may be formed in an upper surface of the pillar type lower electrode 123A. The cylinder type lower electrode 123B may be stacked on the pillar type lower electrode 123A in a structure in which a lower portion of the cylinder type lower electrode 123B is seated in the groove of the pillar type lower electrode 123A. In some example embodiments, the cylinder type lower electrode 123B may be stacked on the pillar type lower electrode 123A without forming the groove in the pillar type lower electrode 123A.

Heights of the pillar type lower electrode 123A and the cylinder type lower electrode 123B may be equal to each other or one of them may be greater than the other. A height of each of the plurality of lower electrodes 123 may range from about 500 nm to about 4000 nm, but example embodiments are not limited to such numeral values. The lower electrode 123 may include any one selected from the group consisting of a metal nitride layer, a metal layer, and a combination of the metal nitride layer and the metal layer.

If a capacitor is formed by employing the lower electrode 123 to which the pillar type lower electrode 123A and the cylinder type lower electrode 123B are combined, high charging capacitance may be obtained compared to a capacitor employing only pillar type lower electrodes having the same height. Further, if the capacitor is formed by employing the lower electrode 123 to which the pillar type lower electrode 123A and the cylinder type lower electrode 123B are combined, collapse or fracture of the lower electrode 123 may be reduced compared to a capacitor employing only cylinder type lower electrodes having the same height.

Figure 17:
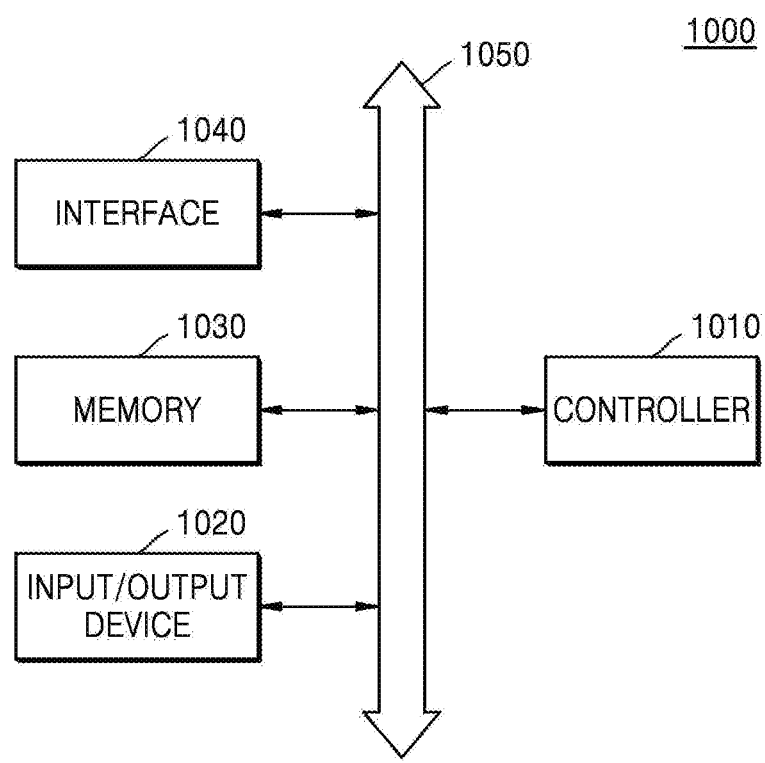
FIG. 17 is a block diagram of a system including a semiconductor device according to an example embodiment of the inventive concepts.

FIG. 17 is a block diagram of a system 1000 including a semiconductor device according to an example embodiment of the inventive concepts.

Referring to FIG. 17, the system 1000 may include a controller 1010, an input/output device 1020, a memory 1030, an interface 1040, and a bus 1050.

The system 1000 may be a mobile system or a system that transmits and receives data. In some example embodiments, the mobile system may be a portable computer, a web tablet, a wireless phone, a mobile phone, a digital music player, or a memory card.

The controller 1010 may be used to control a program executed in the system 1000 and may be a microprocessor, a digital signal processor, a microcontroller, or a similar device.

The input/output device 1020 may be used to input or output data to or from the system 1000. The system 1000 may be connected to an external device (e.g., a personal computer) via the input/output device 1020 or a network, and exchange data with the external device. The input/output device 1020 may be, for example, a keypad, a keyboard, or a display.

The memory 1030 may store data for operating the controller 1010 or may store data processed by the controller 1010. The memory 1030 may include one of the semiconductor devices 100, 200, and 300 according to the example embodiments described above.

The interface 1040 may be a data transmission path between the system 1000 and an external device. The controller 1010, the input/output device 1020, the memory 1030, and the interface 1040 may communicate with one another via the bus 1050.

While the inventive concepts have been particularly shown and described with reference to some example embodiments above, it will be understood that various changes in form and details may be made therein without departing from the spirit and scope of the following claims.

What is claimed is:

1. A semiconductor device comprising:
   a plurality of lower electrodes in a honeycomb structure; and
   a support structure connecting and supporting the plurality of lower electrodes, the support structure including a plurality of open areas, the plurality of lower electrodes exposed by the plurality of open areas,
   wherein the plurality of lower electrodes in the honeycomb structure are arranged such that one lower electrode at a center point of a hexagon and six lower electrodes at vertices of the hexagon and adjacent to the one lower electrode configure a first hexagonal structure, the six lower electrodes at the vertices of the first hexagonal structure serves as lower electrodes at center points of six other hexagonal structures, and the one lower electrode at the center point of the first hexagonal structure serves as a lower electrode at one of six vertices of each of six other hexagonal structures, and wherein the plurality of open areas expose three side areas of the one lower electrode at the center point of the first hexagonal structure, and two side areas of the six lower electrodes at the vertices of the first hexagonal structure.

2. The semiconductor device of claim 1, wherein the support structure comprises:
a first support pattern inside a circular structure, the circular structure defined by a virtual line enclosing a set of circularly provided open areas from among the plurality of open areas; and
a second support pattern outside the circular structure and spaced apart from the first support pattern.

3. The semiconductor device of claim 2, wherein the one lower electrode at the center point of the first hexagonal structure is in contact with only the second support pattern, and the six lower electrodes at the vertices of the first hexagonal structure are in contact with both the first support pattern and the second support pattern.

4. The semiconductor device of claim 2, wherein a diameter of the first support pattern is greater than that of each of the plurality of lower electrodes, and a diameter of the circular structure is greater than that of the first support pattern.

5. The semiconductor device of claim 2, wherein a center point of the circular structure and a center point of the first support pattern are identical to each other.

6. The semiconductor device of claim 2, wherein the first support pattern and the second support pattern have different shapes.

7. The semiconductor device of claim 1, wherein the plurality of open areas have doughnut shapes, each including three separated sub areas, and
each of the three sub areas exposes three adjacent lower electrodes from among the plurality of lower electrodes.

8. The semiconductor device of claim 7, wherein an exposed area of one of the three adjacent lower electrodes exposed by one of the three sub areas is different from an exposed area of each of the remaining two of the three adjacent lower electrodes.

9. The semiconductor device of claim 7, wherein the three sub areas have substantially a same planar size to each other.

10. The semiconductor device of claim 1, wherein the plurality of open areas partially expose side portions of all the plurality of lower electrodes.

11. A semiconductor device comprising:
a plurality of lower electrodes on a substrate, the plurality of lower electrodes in a first direction and a second direction perpendicular to the first direction to form rows and columns; and
a support structure having a flat panel form, the support structure connecting and supporting the plurality of lower electrodes, the support structure including a plurality of open areas defined therein, the support structure including two different shapes in an alternating manner in a third direction, the plurality of open areas having a same shape and partially exposing sides of all the plurality of lower electrodes.

12. The semiconductor device of claim 11, wherein the plurality of open areas form a plurality of circular structures to form a plurality of rows in the first direction and a plurality of columns in the second direction, and
each of the plurality of circular structures is defined by a virtual line enclosing a set of circularly provided open areas from among the plurality of open areas.

13. The semiconductor device of claim 12, wherein a first set of the plurality of open areas on a first row is provided in a misaligned manner with respect to a second set of the plurality of open areas on a second row adjacent to the first row.

14. The semiconductor device of claim 12, wherein six adjacent lower electrodes from among the plurality of lower electrodes that are partially exposed to an open area defined inside the circular structure comprise three first lower electrodes inside the circular structure and three second lower electrodes outside the circular structure.

15. The semiconductor device of claim 14, wherein partially exposed areas of the three first lower electrodes and partially exposed areas of the three second lower electrodes are different from each other.

16. A semiconductor device comprising:
a plurality of lower electrodes in rows and columns on a substrate, the plurality of lower electrodes in a honeycomb structure, the honeycomb structure including one lower electrode at a center point of a hexagon and six lower electrodes at vertices of the hexagon and adjacent to the one lower electrode, the six lower electrodes at the vertices of the hexagon serving as lower electrodes at center points of six other hexagons, the one lower electrode at the center point of the hexagon serving as a lower electrode at one of six vertices of each of six other hexagons; and
a support structure connecting and supporting the plurality of lower electrodes, the support structure including a plurality of first support patterns and a second support pattern, the plurality of first support patterns each having a circular shape, the second support pattern surrounding the plurality of first support patterns and separated from each of the plurality of first support patterns.

17. The semiconductor device of claim 16, wherein a plurality of open areas are defined by spaces between the plurality of first support patterns and the second support pattern.

18. The semiconductor device of claim 17, wherein each of the plurality of open areas partially exposes side surface of the six lower electrodes from among the plurality of lower electrodes.

19. The semiconductor device of claim 17, wherein each of the plurality of open areas has a doughnut shape and includes three sub areas divided by three lower electrodes from among the plurality of lower electrodes.

20. The semiconductor device of claim 19, wherein each of the three sub areas partially exposes side surface of three adjacent lower electrodes from among the plurality of lower electrodes.

* * * * *